(12) United States Patent
Segal-Peretz et al.

(10) Patent No.: US 12,091,745 B2
(45) Date of Patent: Sep. 17, 2024

(54) THREE-DIMENSIONAL NANO-PATTERNS

(71) Applicant: TECHNION RESEARCH & DEVELOPMENT FOUNDATION LIMITED, Haifa (IL)

(72) Inventors: Tamar Segal-Peretz, Kiryat Tivon (IL); Barun Kumar Barick, Odisha (IN); Rotem Azoulay, Megadim (IL)

(73) Assignee: TECHNION RESEARCH & DEVELOPMENT FOUNDATION LIMITED, Haifa (IL)

( * ) Notice: Subject to any disclaimer, the term of this patent is extended or adjusted under 35 U.S.C. 154(b) by 153 days.

(21) Appl. No.: 17/432,931

(22) PCT Filed: Feb. 23, 2020

(86) PCT No.: PCT/IL2020/050196
§ 371 (c)(1),
(2) Date: Aug. 22, 2021

(87) PCT Pub. No.: WO2020/170255
PCT Pub. Date: Aug. 27, 2020

(65) Prior Publication Data
US 2022/0170148 A1  Jun. 2, 2022

Related U.S. Application Data

(60) Provisional application No. 62/912,128, filed on Oct. 8, 2019, provisional application No. 62/814,923, filed on Mar. 7, 2019, provisional application No. 62/808,894, filed on Feb. 22, 2019.

(51) Int. Cl.
| | |
|---|---|
| *C23C 16/04* | (2006.01) |
| *B82B 3/00* | (2006.01) |
| *C23C 16/02* | (2006.01) |
| *C23C 16/455* | (2006.01) |
| *C23C 16/56* | (2006.01) |

(52) U.S. Cl.
CPC ............ *C23C 16/04* (2013.01); *B82B 3/0014* (2013.01); *C23C 16/0272* (2013.01); *C23C 16/45502* (2013.01); *C23C 16/45527* (2013.01); *C23C 16/56* (2013.01)

(58) Field of Classification Search
None
See application file for complete search history.

(56) References Cited

U.S. PATENT DOCUMENTS

| | | | | |
|---|---|---|---|---|
| 8,247,033 B2 * | 8/2012 | Russell | .................. | G03F 7/0002 427/256 |
| 2011/0020608 A1 * | 1/2011 | Lee | ..................... | B81C 1/00031 427/284 |
| 2011/0206846 A1 * | 8/2011 | Elam | .................. | C23C 16/45553 427/255.32 |
| 2012/0046421 A1 * | 2/2012 | Darling | ............... | H01M 50/446 525/360 |
| 2012/0241411 A1 * | 9/2012 | Darling | ............... | H01L 21/3065 216/67 |
| 2017/0114246 A1 * | 4/2017 | Arellano | .............. | C09D 169/00 |
| 2019/0004215 A1 | 1/2019 | Black et al. | | |

FOREIGN PATENT DOCUMENTS

| | | | | |
|---|---|---|---|---|
| JP | 2007125699 A | * | 5/2007 | |
| WO | WO-2011094857 A1 | * | 8/2011 | ............. B82Y 30/00 |

OTHER PUBLICATIONS

Rahman, Atikur et al. Non-native three-dimensional block copolymer morphologies. Nature Communications, pp. 1-8, Dec. 22, 2016 (Year: 2016).*
Glass Transition Temperature of PET. Thermal Analysis Lab. May 2016, retrieved onlyJul. 20, 2023.*
Peng Q, Tseng YC, Darling SB, Elam Jw. A route to nanoscopic materials via sequential infiltration synthesis on block copolymer templates. ACS Nano. Jun. 28, 2011;5(6):4600-6. doi: 10.1021/nn2003234. Epub May 2, 20114. PMID: 21545142.
Kinshuai Zhang, Jing Liu, Bo Wang, Tianchong Zhang, and Futing Yi , "Fabrication of silicon nanotip arrays with high aspect ratio by cesium chloride self-assembly and dry etching", AIP Advances 4, 031335 (2014) https://doi.org/10.1063/1.4869238.
Peng, Q., Tseng, Y .- C., Darling, S. B., & Elam, J. W. (2010). Nanoscopic Patterned Materials with Tunable Dimensions via Atomic Layer Deposition on Block Copolymers. Advanced Materials, 22(45), 5129-5133. doi:10.1002/adma.201002465.
Nam, Chang-Yong & Stein, Aaron & Kisslinger, Kim. (2015). Direct fabrication of high aspect ratio metal oxide nanopatterns via sequential infiltration synthesis in lithographically defined SU-8 templates. Journal of Vacuum Science and Technology B: Nanotechnology and Microelectronics. 33. 06F201 10.1116/1.4929508.
Eng, C. Z., & Losego, M. D. (2017). Vapor phase infiltration (VPI) for transforming polymers into organic-inorganic hybrid materials: a critical review of current progress and future challenges. Materials Horizons, 4(5), 747-771. doi:10.1039/c7mh00196g.
C. Y. Nam, A. Stein, and K. Kisslinger, "Direct fabrication of high aspect ratio metal oxide nanopatterns via sequential infiltration synthesis in lithographically defined SU-8 templates," J. Vac. Sci. Technol., B: Nanotechnol. Microelectron.: Mater., Process., Meas., Phenom. 33, 06F201 (2015). https://doi.org/10.1116/1.4929508.
Nam, C .- Y., & Stein, A. (2017). Extreme Carrier Depletion and Superlinear Photoconductivity in Ultrathin Parallel-Aligned ZnO Nanowire Array Photodetectors Fabricated by Infiltration Synthesis. Advanced Optical Materials, 5(24), 1700807. doi:10.1002/adom. 201700807.
Subramanian, A., Doerk, G. S., Kisslinger, K., Yi, D. H., Grubbs, R. B. B., & Nam, C.- Y. (2019). Three-Dimensional Electroactive ZnO Nanomesh Directly Derived from Hierarchically Self-Assembled Block Copolymer Thin Films. Nanoscale. doi: 10.1039/c9nr00206e.

(Continued)

*Primary Examiner* — David P Turocy
(74) *Attorney, Agent, or Firm* — The Roy Gross Law Firm, LLC; Roy Gross

(57) ABSTRACT

A method for making 3D nano-structure comprising at least two materials by spatially controlling the growth of the materials, is provided. Further, a method for making 3D nano-structure bound to a thermally labile substrate is provided. Composites, comprising a substrate bound to a 3D nano-structure, wherein the 3D nano-structure is arranged in a pattern are provided.

8 Claims, 8 Drawing Sheets

(56) References Cited

OTHER PUBLICATIONS

Rahman, A., Majewski, P., Doerk, G. et al. Non-native three-dimensional block copolymer morphologies. Nat Commun 7, 13988 (2016). https://doi.org/10.1038/ncomms13988.

Zhou, C., Segal-Peretz, T., Oruc, M. E., Suh, H. S., Wu, G., & Nealey, P. F. (2017). Fabrication of Nanoporous Alumina Ultrafiltration Membrane with Tunable Pore Size Using Block Copolymer Templates. Advanced Functional Materials, 27(34), 1701756. doi:10.1002/adfm.201701756.

Weisbord, I., Shomrat, N., Moshe, H., Sosnik, A., & Segal-Peretz, T. (2019). Nano Spray-Dried Block Copolymer Nanoparticles and Their Transformation into Hybrid and Inorganic Nanoparticles. Advanced Functional Materials, 1808932. doi:10.1002/adfm.201808932.

Xiong, S., Wan, L., Ishida, Y., Chapuis, Y.-A., Craig, G. S. W., Ruiz, R., & Nealey, P. F. (2016). Directed Self-Assembly of Triblock Copolymer on Chemical Patterns for Sub-10-nm Nanofabrication via Solvent Annealing. ACS Nano, 10(8), 7855-7865. doi:10.1021/acsnano.6b03667.

Yang GW, Wu GP, Chen X, et al. Directed Self-Assembly of Polystyrene-b-poly(propylene carbonate) on Chemical Patterns via Thermal Annealing for Next Generation Lithography. Nano Letters. Feb. 2017; 17(2):1233-1239. DOI: 10.1021/acs.nanolett.6b05059. PMID: 28068100.

Kim, J. J., Suh, H. S., Zhou, C., Mane, A. U., Lee, B., Kim, S. et al. (2018). Mechanistic understanding of tungsten oxide in-plane nanostructure growth via sequential infiltration synthesis. Nanoscale, 10(7), 3469-3479. doi: 10.1039/c7nr07642h.

Yi, D. H., Nam, C.-Y., Doerk, G., Black, C. T., & Grubbs, R. B. (2019). Infiltration Synthesis of Diverse Metal Oxide Nanostructures from Epoxidized Diene-Styrene Block Copolymer Templates. ACS Applied Polymer Materials, 1(4), 672-683. https://doi.org/10.1021/acsapm.8b00138.

Waldman, R. Z., Jeon, N., Mandia, D. J., Heinonen, O., Darling, S. B., & Martinson, A. B. F. (2019). Sequential Infiltration Synthesis of Electronic Materials: Group 13 Oxides via Metal Alkyl Precursors. Chemistry of Materials. doi:10.1021/acs.chemmater.9b01714.

Barick BK, Simon A, Weisbord I, Shomrat N, Segal-Peretz T. Tin oxide nanostructure fabrication via sequential infiltration synthesis in block copolymer thin films. J Colloid Interface Sci. Dec. 1, 2019;557:537-545. doi: 10.1016/j.cis.2019.09.044. Epub Sep. 13, 2019. PMID: 31550646.

PCT International Search Report for International Application No. PCT/IL2020/050196, mailed Jun. 8, 2020, 3pp.

PCT Written Opinion for International Application No. PCT/IL2020/050196, mailed Jun. 8, 2020, 8pp.

\* cited by examiner

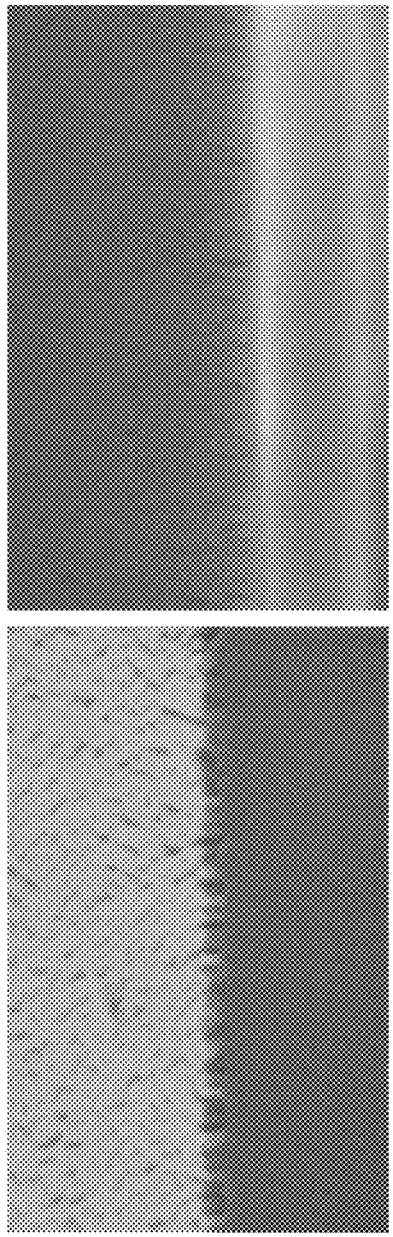
FIGURE 3A
FIGURE 3B
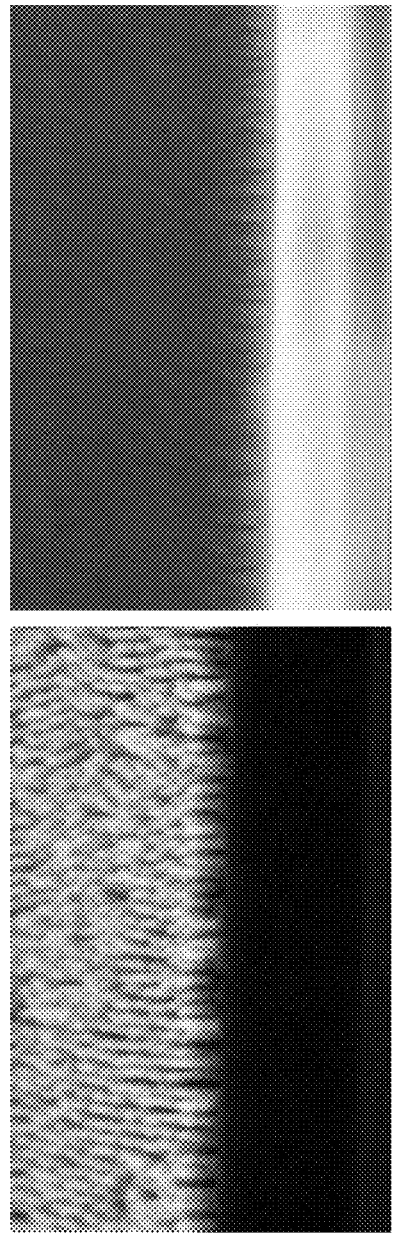
FIGURE 3C
FIGURE 3D

THREE-DIMENSIONAL NANO-PATTERNS

CROSS REFERENCE TO RELATED APPLICATIONS

This application is a National Phase of PCT Patent Application No. PCT/IL2020/050196 having International filing date of Feb. 23, 2020, which claims the benefit of priority under 35 USC § 119(e) of U.S. Provisional Patent Application Nos. 62/808,894, filed Feb. 22, 2019, entitled "FORMATION OF MULTI-MATERIAL AND HIGH-ASPECT RATIO NANOSTRUCTURED ARRAY", 62/912,128, filed Oct. 8, 2019, entitled "THREE-DIMENSIONAL NANO-PATTERNS", and 62/814,923, filed Mar. 7, 2019, entitled "THREE-DIMENSIONAL NANO-HETEROSTRUCTURES" the contents of which are incorporated herein by reference in their entirety.

FIELD OF THE INVENTION

The present invention is in the field of material science.

BACKGROUND OF THE INVENTION

Today, the most commonly used method for nano-patterning is photolithography, which is based upon the use of photoresist polymers as masks. The use of such masks in the semiconductor industry defines where processes such as etching, doping, and deposition will be performed. In order to define complex, three-dimensional structures, multiple steps are required which result in a large number of polymeric masks and processes. Besides the intricate process, photolithography often includes elevated temperatures process steps, thus making it incompatible with heat sensitive polymeric substrates. Therefore, a need exists in the field to search for new nano-fabrication methods, which do not require high temperatures and are compatible with a wide range of thermally labile substrates.

SUMMARY OF THE INVENTION

In one aspect of the invention, provided herein is a method for fabricating a 3D nano-structure comprising a plurality of materials, comprising:
  a. forming a template by contacting a substrate with a polymer, wherein the polymer comprises reacting sites for a plurality of material precursors, thereby forming the template;
  b. sequentially exposing the template with any of the plurality of material precursors for a time period sufficient to bind the plurality of material precursors with at least a portion of the reacting sites, thereby forming a complex;
  c. oxidizing the complex; and
  d. repeating steps b and c n times, wherein n is between 0 and 1000; thereby fabricating the 3D nano-structure bound to the substrate.

In another aspect of the invention, provided herein is method for fabricating a 3D nano-structure bound to a thermally labile substrate, comprising:
  a. forming a template by contacting the thermally labile substrate with a polymer, wherein the polymer comprises reacting sites for one or more material precursor, thereby forming the template;
  b. exposing the template with the one or more material precursor for a time period sufficient to bind the one or more material precursor with at least a portion of the reacting sites, thereby forming a complex;
  c. oxidizing the complex; and
  d. repeating steps b and c n times, wherein n is between 0 and 1000;
wherein steps a to d are performed at a temperature compatible with the thermally labile substrate, thereby fabricating the 3D nano-structure bound to the thermally labile substrate.

In one embodiment, the one or more material precursor comprises a plurality of material precursors.

In one embodiment, the method is for fabricating a 3D nano-structure comprising a plurality of materials.

In one embodiment, the contacting is by solvent vapor annealing.

In one embodiment, the method further comprises a first etching step, selected form the group comprising: plasma etching, heat treatment, and UV-ozone exposure, thereby removing at least a portion of the polymer.

In one embodiment, the method further comprises a second etching step, comprising reactive ion etching, thereby removing at least a portion of the 3D nano-structure.

In one embodiment, the first etching step and the second etching step are performed at a temperature compatible with the thermally labile substrate.

In one embodiment, the compatible is substantially maintaining a structural intactness of the thermally labile substrate.

In one embodiment, the thermally labile substrate is selected from the group comprising a polymeric substrate, and a multi-layer substrate.

In one embodiment, the method further comprises performing a passivation step before the step a.

In one embodiment, the passivation step comprises:
  (i) exposing the thermally labile substrate with the one or more material precursor;
  (ii) performing the step c;
  (iii) repeating steps (i) and (ii) n times, wherein n is between 1 and 1000.

In one embodiment, the exposing is by atomic layer deposition.

In one embodiment, the one or more material precursor and the plurality of material precursors are gaseous precursors.

In one embodiment, the exposing is by diffusion of the gaseous precursors.

In one embodiment, the substrate is selected from the group comprising: silicon, silicon carbide, silicon nitride, a metallic substrate, and a glass substrate or any combination thereof.

In one embodiment, the one or more material and the plurality of materials comprise a metal.

In one embodiment, the metal is selected from the group comprising: aluminum (Al), zinc (Zn), tungsten (W), titanium (Ti), silicon (Si), zirconium (Zr), hafnium (Hf), hafnium (Hf), tin (Sn), gallium (Ga), molybdenum (Mo), nickel (Ni), vanadium (V), platinum (Pt), tantalum (Ta), germanium (Ge) and Niobium (Nb), or any combination thereof.

In one embodiment, the oxidizing is by a compound selected from the group comprising: water, and hydrogen peroxide.

In one embodiment, the polymer comprises a block copolymer configured to form a pattern of structurally ordered polymeric blocks.

In one embodiment, the block copolymer comprises at least two polymers selected from the group comprising: polystyrene (PS), poly(n-alkyl methacrylate) (PnAMA), poly(n-butyl methacrylate) (PBMA), poly(methyl methacrylate) (PMMA), poly(2-vinylpyridine) (P2VP), poly(ferrocenyldimethylsilane) (PFDMS), poly(dimethylsiloxane) (PDMS), polyisoprene, (PI), poly(ethylene-alt-propylene) (PEP), polyethylene (PE), polybutadiene (PB), poly(ethylene oxide) (PEO), poly(ferrocenylethylmethylsilane) (PFEMS), poly(tert-butyl methacrylate) (PtBMA), poly(α-methylstyrene) (PαMS), poly(4-hydroxy styrene) (PHS), and poly(4-vinylpyridine) (P4VP).

In one embodiment, the template is characterized by a pattern of structurally ordered polymeric blocks.

In one embodiment, the 3D nano-structure maintains substantially its configuration after the first etching step and the second etching step.

In one embodiment, the configuration is determined by the pattern of the template.

In one embodiment, the pattern comprises a plurality of aligned cylinders.

In another aspect of the invention, provided herein is a composite, comprising a substrate bound to a 3D nano-structure comprising two or more materials, wherein the 3D nano-structure is arranged in a pattern.

In one embodiment, the substrate is selected from the group comprising: silicon, silicon carbide, silicon nitride, a metallic substrate, and a glass substrate or any combination thereof.

In another aspect of the invention, provided herein is a composite, comprising a 3D nano-structure bound to a thermally labile substrate, wherein the 3D nano-structure is arranged in a pattern, and wherein the 3D nano-structure comprises one or more materials.

In one embodiment, the 3D nano-structure comprises two or more materials.

In one embodiment, the thermally labile substrate is selected from the group comprising a polymeric substrate, and a multi-layer substrate.

In one embodiment, the one or more materials and the two or more materials comprise a metal selected from the group consisting of comprising: aluminum (Al), zinc (Zn), tungsten (W), titanium (Ti), silicon (Si), zirconium (Zr), hafnium (Hf), hafnium (Hf), tin (Sn), gallium (Ga), molybdenum (Mo), nickel (Ni), vanadium (V), platinum (Pt), tantalum (Ta), germanium (Ge) and Niobium (Nb), or any combination thereof.

In one embodiment, the composite is characterized by a spatial distribution pattern of the two or more materials within the template.

In another aspect of the invention, provided herein is an article comprising the composite of the invention.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Further embodiments and the full scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 3 A-D represent a SEM image showing the effect of reactive ion etching (RIE) time on the height of the patterned 3D nano-structure. FIG. 3A shows the effect of 5 min RIE, resulting in a height of ca. 60 nm. FIG. 3B shows the effect of 8 min RIE, resulting in a height of ca. 80 nm. FIG. 3C shows the effect of 10 min RIE, resulting in a height of ca. 90 nm. FIG. 3D shows the effect of 15 min RIE, resulting in a height of ca. 110 nm.

FIGS. 5 A-B represent images of layered 3D nano-structure comprising a bottom layer containing alumina, and a top layer containing zinc oxide.

FIGS. 6 A-B represent a backscattered electron SEM image of 3D heterostructures on silica substrate.

FIG. 7A is an image of a self-assembled PS-b-PMMA layer. FIG. 7B is an image of a self-assembled PS-b-PMMA layer after 3 hours of heat treatment at 80° C. (annealing). FIG. 7C is an image of a self-assembled PS-b-PMMA layer after 8 cycles of $Al_2O_3$ SIS without surface passivation of the substrate.

FIG. 7D is an image of a self-assembled PS-b-PMMA layer after 8 cycles of SIS with surface passivation of substrate. FIG. 7E is an image of a self-assembled PS-b-PMMA layer after 8 cycles of SIS with surface passivation of substrate and after $O_2$ plasma etching of the organic template.

DETAILED DESCRIPTION OF THE INVENTION

Figure 1:
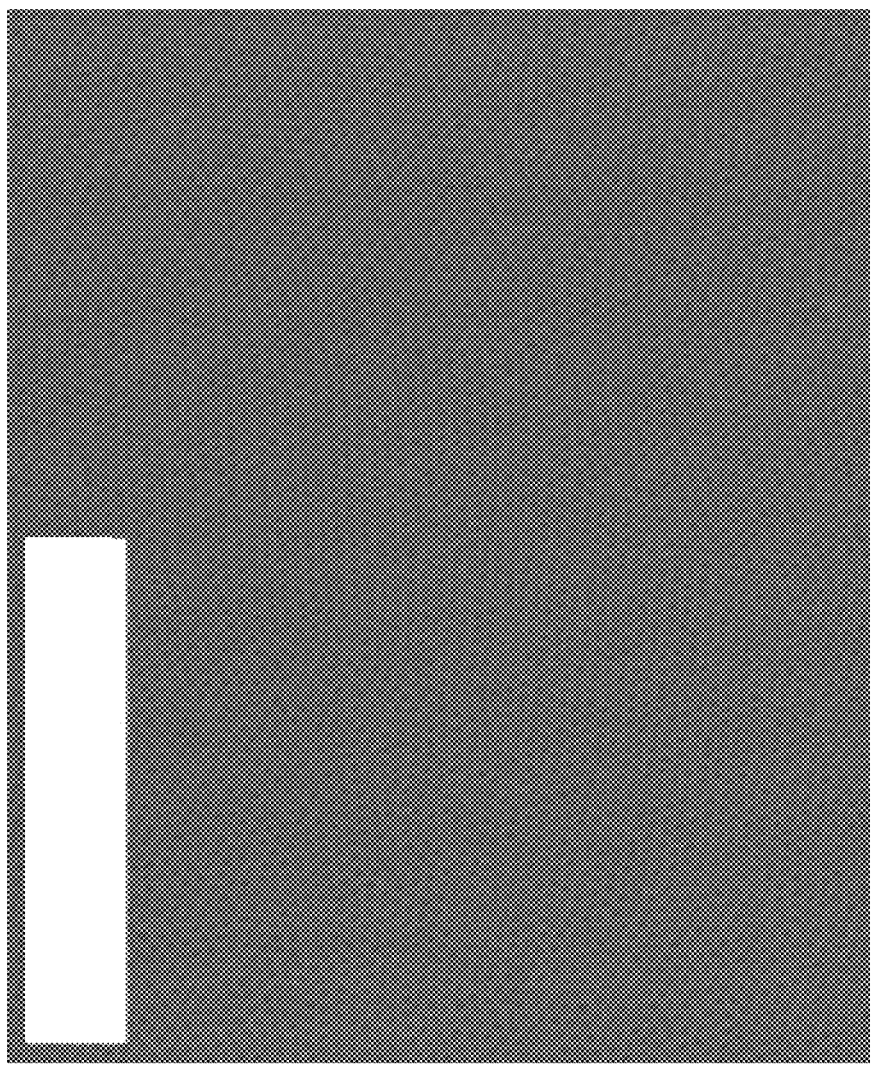
FIG. 1 represents a scanning electron microscope (SEM) image showing an organized pattern formed by a self-assembled polymer applied on the substrate.

According to one aspect of the invention, provided herein a method for fabricating a 3D nano-structure comprising a plurality of materials, comprising:
a. forming a template by contacting a substrate with a polymer, wherein the polymer comprises reacting sites for a plurality of material precursors;
b. sequentially exposing the template with any of the plurality of material precursors for a time period sufficient to bind the plurality of material precursors with at least a portion of the reacting sites, thereby forming a complex;
c. oxidizing the complex; and d. repeating steps b and c n times, wherein n is between 0 and 100; thereby fabricating the 3D nano-structure bound to the substrate.

In some embodiments, the plurality of materials are inorganic materials.

In some embodiments, the plurality of materials comprise a metal.

In some embodiments, the 3D nano-structure is a 3D nano-composite.

According to another aspect of the invention, provided herein a method for fabricating a 3D nano-structure bound to a thermally labile substrate, comprising:
  a. forming a template by contacting the thermally labile substrate with a polymer, wherein the polymer comprises reacting sites for a plurality of material precursors;
  b. sequentially exposing the template with any of the plurality of material precursors for a time period sufficient to bind the plurality of material precursors with at least a portion of the reacting sites, thereby forming a complex;
  c. oxidizing the complex; and
  d. repeating steps b and c n times, wherein n is between 0 and 100;
wherein steps a to d are performed at a temperature compatible with the thermally labile substrate, thereby fabricating the 3D nano-structure bound to the thermally labile substrate.

The invention in one aspect thereof, is related to a method for manufacturing a 3D nano-heterostructure on a substrate, wherein the 3D nano-heterostructure comprises two or more material.

In another aspect of the invention, there is a method for manufacturing a 3D nano-structure (such as a 3D nano-structure comprising one or more materials) on an optical element (such as an optical lens) comprising a thermally labile substrate. The method of the invention in some exemplary embodiments thereof, provides manufacturing conditions (e.g. temperature, diffusion time, annealing process and passivation pretreatment) which are compatible with the thermally labile substrate (e.g. a polymeric substrate). Furthermore, the method of the invention provides a pretreatment step comprising passivation, so as to prevent adsorption of organometallic precursors to the polymeric substrate and to avoid disassembly of the template. Thus, the method of the invention in some embodiments thereof, provides advantageous conditions for fabrication a 3D nano-structure on a thermally labile substrate without impairing stability and functional properties of the substrate.

Template Formation on a Thermally Stable Substrate

In some embodiments, the method comprises step a of template formation. In some embodiments, step a comprises contacting a substrate with a polymer. In some embodiments, the step a results in a formation of a polymeric layer bound to a substrate.

In some embodiments, provided herein a method of forming a multi-layer template. In some embodiments, the method of forming the multi-layer template comprises a method of forming a first polymeric layer, and a method of forming a second polymeric layer.

In some embodiments, the method of forming a first polymeric layer comprises contacting a substrate with a first polymer, to obtain a first polymeric layer bound to a substrate. In some embodiments, the method of forming a second polymeric layer comprises contacting a substrate with a second polymer, to obtain the multi-layer template comprising a first polymeric layer and a second polymeric layer.

In some embodiments, the method of forming the first polymeric layer is by applying a first polymer to a substrate by a method selected from the group comprising: spin casting, spin coating, dip coating, blade coating, roll to roll processes, or any combination thereof. In some embodiments, the method of forming the first polymeric layer further comprises curing. In some embodiments, curing is performed by UV-crosslinking.

In some embodiments, the method of forming the second polymeric layer is by applying a second polymer to the first polymeric layer, thereby obtaining the second polymeric layer in contact with the first polymeric layer. In some embodiments, the second polymeric layer is bound to the first polymeric layer. In some embodiments, a second polymer is applied as described hereinabove for the first polymeric layer. In some embodiments, a second polymer is as described hereinbelow. It should be apparent to a person skilled in the art that the application method for the first and/or for the second polymeric layer will depend inter alia on thermal and chemical stability of the substrate. For example, the method is performed at a temperature which doesn't induces a substantial substrate deformation (e.g., below the melting point (Tm) of the thermally labile substrate, as described herein).

As used herein, "crosslinked" and/or "crosslinking", and any grammatical derivative thereof refers generally to a chemical process or the corresponding product thereof in which two chains of polymeric molecules are attached by bridges (cross-linker) composed of an element, a group or a compound, which join certain atoms of the polymeric chains.

The term "UV curing" is used herein to mean a process in which ultraviolet light and visible light are used to initiate a photochemical reaction that generates a crosslinked network of polymers.

Without being bound to any theory or mechanism, it is postulated that when the second polymer (e.g. comprising a block-copolymer) is applied on a substrate as described herein below, it generally becomes kinetically trapped in non-equilibrium, disorganized, and non-defined structures. Since a spatial orientation of the second polymer dictates a final configuration of the resulting nano-composite, the disorganized second polymer has to be converted into a highly organized structure predicted at equilibrium. In some exemplary embodiments, a highly organized state of the second polymer comprises spatially organized polymeric blocks.

In some embodiments, the second polymer is converted into an organized structure by thermal annealing. In some embodiments, thermal annealing is performed at a temperature ranging from 100 to 300° C., from 100 to 250° C., from 100 to 200° C., from 100 to 150° C., from 150 to 200° C., from 200 to 250° C., from 250 to 300° C., or any range or value therebetween. In some embodiments, upon thermal annealing the second polymer self assembles into an organized structure, as shown by FIG. 1. In some embodiments, thermal annealing is performed for a time period sufficient to induce self-assembly of the second polymer. In some embodiments, self-assembly comprises forming a plurality of structurally ordered domains, as described herein. In some embodiments, the time period for thermal annealing is between 0.5 and 5 h, between 0.5 and 1 h, between 1 and 1.5 h, between 1.5 and 2 h, between 2 and 2.5 h, between 2.5 and 3 h, between 3 and 3.5 h, between 3.5 and 4 h, between 4 and 5 h, between 1.5 and 3.5 h, between 2.5 and 3.5 h, between 2 and 3 h, or any range or value therebetween.

In some embodiments, the time period for thermal annealing is at least 1.5 h, at least 2 h, at least 2.5 h, at least 3 h, including any range or value therebetween.

In some embodiments, a substrate is an inorganic substrate. In some embodiments, a substrate is selected from the group comprising: a metal, silicon, silicon carbide, silicon nitride, silicon oxynitride, carbon-based substrate, a metal oxide (such as titanium oxide, zirconium oxide, aluminum oxide) and a glass substrate or any combination thereof. In some embodiments, a substrate comprises a thermally stable polymer.

As used herein the term "thermally stable" is referred to a substrate (such as an inorganic substrate, or a thermally stable polymer) which maintains substantially its structural intactness (e.g. devoid of cracking and crazing) and/or tensile strength at a temperature of more than 200° C. The tensile strength is determined as the maximal stress which can be applied, before failure of the tested material occurs (e.g., as rupture or necking).

In some embodiments, substantially means at least 80%, at least 85%, at least 90%, at least 95%, at least 98% including any range or value therebetween. In some embodiments, a thermally stable substrate substantially maintains its functional properties upon exposure to a temperature of more than 200° C.

In some embodiments, the substrate is a solid at a temperature below 150° C., below 180° C., below 170° C., below 190° C., below 200° C., below 210° C., below 220° C., below 250° C., below 270° C., below 300° C., including any range or value therebetween. In some embodiments, the substrate comprises silicon bound to a $SiO_2$ layer. In some embodiments, the substrate comprises $SiO_2$. In some embodiments, the substrate comprises chemically modified Si or $SiO_2$. In some embodiments, the substrate comprises a thermally stable polymer or a thermally stable chemical moiety bound to a $SiO_2$ layer. In some embodiments, the thermally stable polymer comprises one or more layers.

In some embodiments, the template comprises the substrate in contact with a polymeric layer. In some embodiments, the template comprises the substrate bound to a polymeric layer. In some embodiments, a polymeric layer is adhered or adsorbed on the substrate. In some embodiments, a polymeric layer is embedded within the substrate. In some embodiments, the template is a multi-layer template, comprising the substrate bound to two or more polymeric layers. In some embodiments, the multi-layer template comprises a first polymeric layer and a second polymeric layer.

In some embodiments, any of the first polymeric layer and the second polymeric layer are in the form of a film. In some embodiments, any of the first polymeric layer and the second polymeric layer comprises a porous polymer.

In some embodiments, a porous polymer refers to a scaffold for example, having a porosity of greater than 1% to less than or equal to 99%, or having a porosity of greater than 10% to less than or equal to 95%, between 50 and 99%, between 60 and 99%, between 70 and 99%, between 50 and 70%, between 80 and 99%, between 80 and 90%, between 90 and 95%, between 95 and 99%, or having a porosity of greater than 20% to less than or equal to 95%, or having a porosity of greater than 30% to less than or equal to 90%, or having a porosity of greater than 40% to less than or equal to 80%, including any range therebetween.

In some embodiments, any of the first polymeric layer and the second polymeric layer comprises a copolymer. In some embodiments, a copolymer comprise two or more polymers selected from the group consisting of: polystyrene (PS), poly(n-alkyl methacrylate) (PnAMA), poly(n-butyl methacrylate) (PBMA), poly(methyl methacrylate) (PMMA), poly(2-vinylpyridine) (P2VP), poly(ferrocenyldimethylsilane) (PFDMS), poly(dimethylsiloxane) (PDMS), polyisoprene, (PI), poly(ethylene-alt-propylene) (PEP), polyethylene (PE), polybutadiene (PB), poly(ethylene oxide) (PEO), poly(ferrocenylethylmethylsilane) (PFEMS), poly(tert-butylmethacrylate) (PtBMA), poly(α-methylstyrene) (PαMS), poly(4-hydroxy styrene) (PHS), poly(4-vinylpyridine), (P4VP), including any copolymer or any combination thereof.

In some embodiments, the copolymer comprises PS-PMMA copolymer. In some embodiments, a molar ratio of a PS-block to a PMMA block within the PS-PMMA copolymer is between 5:1 and 1:5, between 5:1 and 1:1, between 4:1 and 1:1, between 3:1 and 1:1, between 3:1 and 2:1, between 2:1 and 1:1, between 1:1 and 1:5, between 1:1 and 1:2, between 1:1 and 1:3, between 1:2 and 1:4, between 1:4 and 1:5, including any range or value therebetween.

In some embodiments, an average molecular weight (MW) of the PS-PMMA copolymer is between 10 kDa and 200 kDa, between 10 kDa and 30 kDa, between 30 kDa and 50 kDa, between 50 kDa and 70 kDa, between 70 kDa and 90 kDa, between 75 kDa and 85 kDa, between 50 kDa and 100 kDa, between 60 kDa and 100 kDa, between 50 kDa and 90 kDa, between 90 kDa and 100 kDa, between 100 kDa and 120 kDa, between 120 kDa and 150 kDa, between 150 kDa and 200 kDa, including any range or value therebetween.

In some embodiments, the first polymeric layer comprises a random copolymer. In some embodiments, the second polymeric layer comprises a block copolymer.

"Random copolymers" consisting of randomly ordered monomeric units are well known to those skill in the art. Random copolymers are typically synthesized by a random copolymerization of two or more different monomers. In contrary, a term "block copolymer" relates to a copolymer wherein monomeric units of a given type are organized in blocks (also referred to as "polymeric blocks"), i.e. monomeric units of the same type are adjacent to each other. Block copolymer can be represented by formula $[Ai]_n$-$[Bj]_m$, wherein A and B designate distinct types of monomers organized in blocks ([Ai] and [Bj]), and the indices i, j, n, m are integer numbers having a value of at least 1. Block copolymers are typically synthesized by a copolymerization of at least two blocks.

In some embodiments, the copolymer or block copolymer is capable of spontaneous self-assembly under suitable condition (e.g., thermal annealing), wherein self-assembly is as described herein. In some embodiments, the copolymer or block copolymer comprises a plurality of self-assembled nano-structures within the template. In some embodiments, the copolymer or block copolymer is configured to form a plurality of structurally ordered polymeric blocks.

In some embodiments, at least a part of the block copolymer comprises a plurality of structurally ordered polymeric blocks. In some embodiments, at least a part of the block copolymer comprises a plurality of polymeric blocks having a spatial orientation.

As used herein, the term "structurally ordered" refers to polymeric blocks having similar spatial orientation, in opposite to a randomly ordered polymeric blocks having an irregular orientation. A randomly ordered polymer can be transformed into a structurally ordered confirmation by any one of the methods, as described hereinbelow.

In some embodiments, the second polymeric layer and the first polymeric layer comprise the same polymer. In some embodiments, the second polymeric layer and the first polymeric layer comprise different polymers.

In some embodiments, the second polymeric layer comprises a plurality of structurally ordered polymeric blocks. In some embodiments, a plurality of polymeric blocks has a spatial orientation. In some embodiments, at least a part of polymeric blocks adopts a vertical orientation. In some embodiments, a plurality of structurally ordered polymeric blocks is organized in a pattern. In some embodiments, the pattern is a specific pattern. In some embodiments, the plurality of structurally ordered polymeric blocks is randomly organized within the second polymeric layer. In some embodiments, the plurality of block is provided in a pattern of distinct groups. In some embodiments, the pattern of distinct groups or clusters of the plurality of blocks may be either random or regular; in either instance the plurality of blocks in each distinct group or cluster may be randomly distributed therein. In some embodiments, the pattern comprises a plurality of geometric forms. In some embodiments, at least a part of the second polymeric layer comprises any geometric form that can be patterned on a surface.

In some embodiments, at least a part of the second polymeric layer comprises a plurality of arrays. In some embodiments, at least a part of the second polymeric layer comprises a plurality of aligned cylinders. In some embodiments, a plurality of cylinders is vertically aligned. In some embodiments, at least 50%, at least 60%, at least 70%, at least 80%, at least 90%, at least 95%, at least 99%, of cylinders or ordered structures are vertically aligned. In some embodiments, the plurality of aligned cylinders form an angle with the substrate plane of between 80 and 110°, between 80 and 90°, between 85 and 95°, between 80 and 100°, between 90 and 100°, between 100 and 110°, including any range or value therebetween.

In some embodiments, the plurality of aligned cylinders has a diameter in the range of 5 nm to 1 µm. In some embodiments, the plurality of aligned cylinders or ordered structures have a diameter in the range of 5 nm to 10 nm, 10 nm to 30 nm, 15 nm to 30 nm, 20 nm to 25 nm, 25 nm to 30 nm, 30 nm to 40 nm, 40 nm to 50 nm, 10 nm to 50 nm, 50 nm to 70 nm, 70 nm to 100 nm, 100 nm to 150 nm, 150 nm to 200 nm, 200 nm to 300 nm, 300 nm to 400 nm, 400 nm to 500 nm, 500 nm to 600 nm, 600 nm to 700 nm, 700 nm to 900 nm, 5 nm to 900 nm, 5 nm to 500 nm, 5 nm to 300 nm, 5 nm to 200 nm, 5 nm to 900 nm, 5 nm to 500 nm, 5 nm to 200 nm, 5 nm to 100 nm, 5 nm to 50 nm, including any range or value therebetween.

In some embodiments, at least 50%, at least 60%, at least 70%, at least 80%, at least 90%, at least 95%, at least 99%, of cylinders or ordered structures have an average diameter of at least 5 nm, at least 15 nm, at least 10 nm, at least 20 nm, at least 25 nm, including any range or value therebetween.

In some embodiments, at least 50%, at least 60%, at least 70%, at least 80%, at least 90%, at least 95%, at least 99%, of cylinders or ordered structures have an average diameter of at most 300 nm, at most 250 nm, at most 200 nm, at most 150 nm, at most 100 nm, at most 80 nm, at most 70 nm, at most 60 nm, at most 50 nm, at most 40 nm, at most 30 nm, at most 25 nm, including any range or value therebetween.

In some embodiments, an average distance between the cylinders (such as vertically aligned cylinder) within the second polymeric layer is between 5 and 100 nm, between 5 and 10 nm, between 10 and 20 nm, between 20 and 30 nm, between 20 and 40 nm, between 25 and 40 nm, between 30 and 40 nm, between 40 and 50 nm, between 50 and 60 nm, between 60 and 70 nm, between 70 and 80 nm, between 80 and 100 nm, including any range or value therebetween. In some embodiments, an average distance between the cylinders is predetermined by the chemical structure of the block-copolymer. In some embodiments, an average distance between the cylinders is predetermined by a MW of the block-copolymer. In some embodiments, an average distance between the cylinders is predetermined by a MW of the first polymeric block and of the second polymeric block.

In some embodiments, the second polymeric layer has a thickness in the range of 10 nm to 1 µm. In some embodiments, the second polymeric layer has a thickness in the range of 10 nm to 900 nm, 100 nm to 900 nm, 200 nm to 900 nm, 300 nm to 900 nm, 400 nm to 900 nm, 10 nm to 100 nm, 100 nm to 200 nm, 200 nm to 300 nm, 300 nm to 400 nm, 400 nm to 500 nm, 500 nm to 600 nm, 600 nm to 900 nm, 900 to 1000 nm, 10 nm to 500 nm, 10 nm to 200 nm, or 10 nm to 100 nm, including any range therebetween.

In some embodiments, the first polymeric layer has a thickness in a range from 1 nm to 100 nm, from 1 nm to 10 nm, from 10 nm to 20 nm, from 20 nm to 50 nm, from 50 nm to 100 nm, from 5 nm to 10 nm, including any range therebetween.

In some embodiments, the first polymeric layer has a thickness of at least 10 nm, at least 20 nm, at least 30 nm, at least 50 nm, at least 70 nm, at least 80 nm, at least 100 nm, including any range or value therebetween.

In some embodiments, geometric forms are selected form the group comprising: a sphere, an ellipse, a cylinder, a lamella, a hexagon, a pentagon, an octagon, a rectangular prism, a conus, a bicontinuous cubic form or any combination thereof.

As used herein "pattern" refers to a regularly repeated arrangement, especially a design made from repeated lines or shapes on a surface. The elements of a pattern repeat in a predictable manner.

In some embodiments, the first polymeric layer induces structural orientation of the polymeric blocks of the second polymer. In some embodiments, first polymeric layer controls pattern formation of the structurally ordered polymeric blocks of the second polymer. In some embodiments, the first polymeric layer enables self-assembly or a structural orientation of the polymeric blocks of the second polymer.

In some embodiments, the second polymeric layer comprises the block copolymer, as described herein above. In some embodiments, the block copolymer comprises at least two polymeric blocks having different chemical properties (e.g. one block consists of polar moieties and another one consists of non-polar hydrophobic moieties). In some embodiments, the block copolymer comprises a first polymeric block and a second polymeric block. In some embodiments, a first polymeric block has reactivity for a first material precursor and for a second material precursor. In some embodiments, a first polymeric block comprises a polymer having reactivity to a first material precursor and to a second material precursor.

In some embodiments, a first polymeric block comprises a polymer having binding affinity to a first material precursor and to a second material precursor. In some embodiments, a first polymeric block comprises a polymer having differential binding affinity to a first material precursor and to a second material precursor. In some embodiments, a first material precursor and a second material precursor react selectively with a first polymeric block. In some embodiments, a first polymeric block comprises a functional group having a free pair of electrons. In some embodiments, a first polymeric block comprises a functional group having a Lewis base. In some embodiments, a first polymeric block comprises a functional group having reactivity towards the first material precursor, the second material precursor or both. In some embodiments, a first polymeric block comprises a functional group having reactivity towards a metal alkyl. In some embodiments, a first polymeric block or a monomer of the first polymeric block comprises a functional group selected from carbonyl, carboxyl, ester, a heteroaromatic ring, amide, alcohol, ether, amine, thioester, nitrile, isocyanate, thioisocyanate, anhydride, or a combination thereof. In some embodiments, a first polymeric block comprises a polymer selected from the group comprising: PnAMA, PBMA, PtBMA, PMMA, P2VP, P4VP, PEO, or any combination thereof.

In some embodiments, a second polymeric block is non-reactive with a first material precursor and with a second material precursor. In some embodiments, a second polymeric block is devoid of reacting sites for a first material precursor and for the second material precursor. In some embodiments, a second polymeric block is devoid of binding affinity for a first material precursor and for the second material precursor. In some embodiments, a second polymeric block comprises an aromatic group, an aliphatic group or both. In some embodiments, a second polymeric block comprises polystyrene, a polyolefin, PVC, or any combination thereof.

Nano-Composite Formation by SIS

According to some embodiments, the present invention provides a method for fabricating a 3D nano-structure comprising a plurality of materials in a controlled manner, wherein the plurality of materials comprise a metal.

In some embodiments, the method for fabricating a 3D nano-structure comprises sequentially exposing the template with any of the plurality of material precursors.

In some embodiments, the template is simultaneously exposed with a first material precursor and with a second material precursor, by reacting the template with a mixture of material precursors.

In some embodiments, the material(s) is inorganic material(s). In some embodiments, the inorganic material comprises a metal. In some embodiments, the 3D nano-structure is a 3D patterned nano-structure comprising a plurality of inorganic materials.

In some embodiments, the plurality of inorganic materials comprises a metal, a metal oxide, or a combination thereof.

In some embodiments, the 3D nano-structure can have a broad variety of metal materials, sizes and shapes, by choosing the appropriate material precursors and the template, with tunable characteristics and selective interactions between the material precursors and the template.

In some embodiments, the plurality of material precursors are gaseous precursors. In some embodiments, the plurality of material precursors comprises a metalorganic compound. In some embodiments, the plurality of material precursors comprises a metal alkyl, a metal hydride, a metal halide or a combination thereof.

Non-limiting examples of metals, according to the present invention, include aluminum (Al), zinc (Zn), tungsten (W), titanium (Ti), silicon (Si), zirconium (Zr), hafnium (Hf), tin (Sn), gallium (Ga), molybdenum (Mo), nickel (Ni), vanadium (V), platinum (Pt), tantalum (Ta), germanium (Ge) and Niobium (Nb) or any combination thereof.

Non-limiting examples of metalorganic compounds, according to the present invention, include: $Al(Me)_3$, $Zn(Et)_2$, $WF_6$, $Si_2H_6$, or any combination thereof.

In some embodiments, the template is exposed with the plurality of material precursors to form a complex. In some embodiments, the complex comprises the plurality of material precursors bound to at least a portion of the template. In some embodiments, the complex comprises the plurality of material precursors bound to at least a portion of the reacting sites.

In some embodiments, the complex comprises the plurality of material precursors bound to at least a portion of the first polymeric block. In some embodiments, the complex comprises the plurality of material precursors bound to at least a portion of structurally ordered blocks formed by the first polymeric block. In some embodiments, the plurality of material precursors is in a form of a layered structure within the structurally ordered blocks. In some embodiments, layered structure comprises a plurality of layers. In some embodiments, the plurality of layers comprises alternating layers of material precursors. In some embodiments, the plurality of layers comprises sequential layers having the first material precursor, and sequential layers having the second material precursor. In some embodiments, the plurality of layers comprises randomly distributed layers of different material precursors. In some embodiments, the plurality of layers comprises layers having a plurality of material precursors.

In some embodiments, the plurality of material precursors is mixed so as to result in a composite heterostructure. In some embodiments, the composite heterostructure is homogenous. In some embodiments, the composite heterostructure comprises a plurality of regions, wherein each region comprises a material precursor. In some embodiments, the plurality of regions results in a spatially ordered pattern. In some embodiments, the plurality of regions is randomly distributed within the composite heterostructure.

In some embodiments, the complex is substantially devoid of material precursors bound to the second polymeric block.

In some embodiments, the complex comprises a plurality of complexes. In some embodiments, the complex comprising a plurality of complexes formed by sequentially exposing the template with the plurality of material precursors.

In some embodiments, the plurality of material precursors comprise a first material precursor and a second material precursor.

One skilled in the art will appreciate that the order and the number of the precursors may be altered in various embodiments and that the nomenclature "first material"/"first material precursor" and "second material"/"second material precursor" is used herein for ease of reference. For instance, in some embodiments the second material precursor can be selected to react first with the template. One of skill in the art will further appreciate that various systems may comprise more than two material precursors. In some exemplary embodiment, the plurality of material precursors can further comprise a third material precursor, a fourth material precursor and so on.

In some embodiments, the template is sequentially exposed with the plurality of material precursors for a time period sufficient to bind the plurality of material precursors with at least a portion of the reacting sites. In some embodiments, the time period comprises a plurality of time periods. In some embodiments, the time period comprises a first time period and a second time period. In some embodiments, the first time period is selected so as to enable a substantial binding of the first material precursor with at least apportion of the reacting sites. In some embodiments, the second time period is selected so as to enable a substantial binding of the second material precursor with at least a portion of the reacting sites.

In some embodiments, the template is exposed with a material precursor for a time period sufficient to form a layer of the material precursor. In some embodiments, the template is exposed with a material precursor for a time period sufficient to form a layer of the material precursor within the first polymeric block.

In some embodiments, the template is sequentially exposed with the plurality of material precursors, so as to from a plurality of distinct layers. In some embodiments, at least a portion of the plurality of distinct layers comprise different precursors. In some embodiments, sequentially exposing comprises a time period sufficient to form a plurality of layers, wherein the time period predetermines layer thickness. In some embodiments, the plurality of (distinct) layers comprise layers having the same thickness. In some embodiments, the plurality of (distinct) layers comprise layers of different thickness.

In some embodiments, the plurality of layers are characterized by a thickness in a range between 1 and 100 nm, between 1 and 80 nm, between 1 and 70 nm, between 1 and 50 nm, between 1 and 40 nm, between 1 and 30 nm, between 1 and 20 nm, between 1 and 10 nm, including any range or value therebetween. In some embodiments, the layer thickness is predetermined by exposure time.

In some embodiments, the template is sequentially exposed with the first material precursor for a first time period and then with the second material precursor for a second period of time. In some embodiments, exposing the template with a first material precursor, for a first time period so to bind the first material precursor with a first portion of the reacting sites of the template, forms a first complex. In some embodiments, the first material precursor binds to a first portion of the first polymeric block thereby forming a first complex.

One skilled in the art will appreciate that the order and the number of the complexes may be altered in various embodiments and that the nomenclature "first complex" and "second complex" is used herein for ease of reference. Additionally, one of skill in the art will further appreciate that "the plurality of complexes" may comprise more than two complexes.

In some embodiments, exposing the template with a second material precursor comprising a metal, for a second time period to bind the second material precursor with a second portion of the reacting sites of the template, forms a second complex. In some embodiments, the second material precursor binds to a second portion of the first polymeric block thereby forming a second complex.

In some embodiments, exposing is by diffusion of a gaseous precursor. In some embodiments, exposing is using atomic layer deposition (ALD) technique. In some embodiments, exposing is using sequential infiltration synthesis (SIS) technique.

As used herein, the term "sequential infiltration synthesis" (SIS) refers to a process derived from atomic layer deposition (ALD) in which a polymer is reacted with a gaseous precursor of the inorganic material using sequential, controlled stepwise reactions. The materials nucleate on functional species within the polymer bulk, and these nucleation sites act as seeds for the subsequent growth of inorganic particles within the polymer. There are many nucleation sites (reacting sites) types well-known to one of ordinary skill in the art that can be used according to the present intention. There are many ALD types of chemistry well-known to one of ordinary skill in the art that can be used according to the present intention. By appropriate selection of the precursors, the binding and the chemistry can be controlled.

In some embodiments, the binding of the plurality of material precursors to the template reacting sites is controlled by the reaction between the plurality of material precursors and the first polymeric block.

In some embodiments, the reacting site(s) comprise a chemical moiety. In some embodiments, the first polymeric block comprises a carbonyl group, a pyridine group a hydroxyl group, or any combination thereof.

In some embodiments, the plurality of material precursors selectively binds to the carbonyl group, pyridine group, hydroxyl group, or any combination thereof.

In some embodiments, the first time period is shorter than the second time period. In some embodiments, the first time period is longer than the second time period. In some embodiments, the first time period is equal to the second time period.

In some embodiments, a first time period is a short period of time. In some embodiments, a second time period is a long period of time.

In some embodiments, a first time period is between 5 seconds (s) to 10 minutes (min). In some embodiments, a first time period is between 10 s to 10 min, 20 s to 10 min, 30 s to 10 min, 5 s to 1 min, 5 s to 3 min, 5 s to 2 min, 5 s to 5 min, 10 s to 1 min, 1 min to 10 min, 5 min to 10 min, or 10 s to 5 min, 1 to 10 min, 1 to 3 min, 3 to 4 min, 4 to 5 min, 5 to 7 min, 7 to 10 min, between 0.01 and 1 s, between 0.01 and 0.02 s, between 0.02 and 0.05 s, between 0.05 and 0.1 s, between 0.1 and 0.2 s, between 0.2 and 0.5 s, between 0.5 and 1 s, between 1 and 2 s, between 2 and 5 s, between 5 and 10 s, including any range therebetween.

In some embodiments, a second time period is between 5 seconds to 3 hours. In some embodiments, a second time period is between 10 s to 3 hours, 20 s to 3 hours, 30 s to 3 hours, 5 s to 2 hours, 5 s to 1 hour (h), 5 s to 30 min, 5 s to 45 min, 10 s to 30 min, 1 min to 30 min, 5 min to 3 hours, 10 s to 10 min, 20 s to 10 min, 30 s to 10 min, 5 s to 1 min, 5 s to 3 min, 5 s to 2 min, 5 s to 5 min, 10 s to 1 min, 1 min to 10 min, 1 min to 10 min, 5 min to 10 min, or 10 s to 5 min, 1 to 10 min, 1 to 3 min, 3 to 4 min, 4 to 5 min, 5 to 7 min, 7 to 10 min, 10 min to 30 min, 30 min to 1 h, 1 to 2 h, 2 to 3 h, or 5 min to 10 min, between 0.01 and 1 s, between 0.01 and 0.02 s, between 0.02 and 0.05 s, between 0.05 and 0.1 s, between 0.1 and 0.2 s, between 0.2 and 0.5 s, between 0.5 and 1 s, between 1 and 2 s, between 2 and 5 s, between 5 and 10 s, including any range therebetween.

In some embodiments, the second time period must be longer than the first time period to enable the second precursor to diffuse deeper than the first precursor in the depth of the polymer.

In some embodiments, the time period has to be adjusted so as to form a stable 3D nano-structure. In some embodiments, a stable nano-structure comprises nano rods having a rod diameter of at least 5 nm. In some embodiments, the time period has to be adjusted so as to enable a structural intactness of the 3D nano-structure after a first and/or second etching step, wherein the first and/or second etching step is described herein below. In some embodiments, time periods (total exposure time) have to be adjusted so as to prevent bending of the rods. In some embodiments, total exposure time has to be adjusted so as to result in a predetermined aspect ratio of the plurality of rods, wherein the aspect ratio is as described herein.

Oxidation Step

According to some embodiments of the present invention, after exposing the template with any of the plurality of material precursors, thus forming a complex, the method comprises a step of oxidizing or oxygenating the complex.

In some embodiments, a step of oxidizing or oxygenating the complex as used herein refers to a co-reaction step, wherein the complex (a metalorganic-based complex) undergoes a reaction with a compound so as to form a metal oxide, wherein the compound is as described hereinbelow. It should be apparent to one skilled in the art, that the term "oxidation" as used herein doesn't necessarily mean reduction of the oxidation state of the metal. In some embodiments, the term oxidation is related to a chemical reaction resulting in the formation of the metal oxide. In some embodiments, oxidation is oxygenation.

In some embodiments, the complex is oxidized or oxygenated to form a plurality of metal oxides bound to or in contact with the template. In some embodiments, a plurality of metal oxides is adsorbed to the template. In some embodiments, the complex is oxidized to form a layer comprising a metal oxide. In some embodiments, the complex is oxidized to form a layer comprising a plurality of metal oxides.

In some embodiments, the oxidation or oxygenation step is performed by reacting the complex with a compound selected from the group comprising: water, oxygen, a peroxide (such as a peroxyacid, benzoyl peroxide, a ketone peroxide, a peroxydicarbonate, a peroxyester, a dialkyl peroxide), and hydrogen peroxide. In some embodiments, the compound is in a gaseous state.

In some embodiments, the oxidation or oxygenation step is performed by plasma etching, as described herein below.

In some embodiments, oxidation or oxygenation is hydrolysis. In some embodiments, the oxidation step comprises hydrolysis of the plurality of complexes. In some embodiments, the oxidation step forms a plurality of materials bound to the template. In some embodiments, any of the plurality of materials comprise a metal, a metal oxide or a mixture thereof. In some embodiments, the oxidation step results in formation of a metal oxide bound to the template. In some embodiments, the oxidation step results in formation of a plurality of metal oxides bound to the template.

Non-limiting examples of metal oxides include but are not limited to: aluminum oxide, silicon oxide, zirconium oxide, titanium oxide, or a mixture thereof.

In some embodiments, the oxidation step is performed after exposure to any of the material precursors (such as the first and/or the second material precursor).

In some embodiments, the oxidation step is performed only after exposure to the plurality of material precursors. In some embodiments, the oxidation step is performed only after exposing the template with the plurality of material precursors.

In some embodiments, the oxidation step generates reactive sites to any of the plurality of material precursor. In some embodiments, any of the plurality of material precursor binds to a metal oxide. In some embodiments, a metal oxide catalyzes binding of the plurality of material precursor. In some embodiments, a metal oxide catalyzes the formation of a subsequent metal oxide layer.

As used herein the terms "bind", "bond" in any grammatical form thereof are related to a covalent and/or a non-covalent bond.

In some embodiments, before the oxidation step, the template is devoid of reactive sites. In some embodiments, before the oxidation step any of the plurality of complexes is devoid of reactive sites. In some embodiments, prior to the oxidation step all reactive sites within the layer are occupied with the plurality of material precursors.

Repeating Cycles

According to some embodiments of the present invention, after performing step c (i.e. oxidation step), the present method comprises sequential repeating step b., and step c n times, wherein n is between 0 and 1000. In some embodiments, by repeating step b., and step c n times a plurality of vertical layers is formed. In some embodiments, the plurality of vertical layers forms a 3D nano-structure. In some embodiments, the plurality of vertical layers forms a 3D nano-composite. In some embodiments, any one of the plurality of layers comprises the plurality of materials.

In some embodiments, n times is between 1 and 100, 1 and 25, 5 and 100, 10 and 100, 20 and 100, 50 and 100, 1 and 50, 0 and 100, 0 and 50, 0 and 30, 0 and 20, 1 and 30, or 1 and 20, 20 and 30, 30 and 40, 40 and 50, 50 and 60, 60 and 70, 70 and 80, 80 and 100, 100 and 150, 150 and 200, 200 and 250, 250 and 300, 300 and 400, 400 and 500, 500 and 600, 600 and 700, 700 and 800, 800 and 1000, including any range therebetween.

In some embodiments, the number of n times is determined according to the growth of each material within the template. In some embodiments, the growth and the spatial distribution pattern of each material within the template can be controlled by controlling the number of n times that step b and/or step c are repeated.

In some embodiments, the growth and the spatial distribution pattern of each material within the template can be controlled by controlling the length of the time period (also referred to as "diffusion time"). In some embodiments, the spatial distribution pattern of the material within the template is predetermined by the diffusion time of the material precursor. In some embodiments, the spatial distribution pattern of each material within the template is controlled by adjusting the diffusion time and the number of n times that step b and/or step c are repeated.

In some embodiments, the limit of the n times is determined by the saturation point of the template. As used herein, "saturation point" refers to a point where there are no more reacting sites available, or a point where the reactive domain of the block copolymer is substantially occupied with the plurality of vertical layers.

3D Nano-Structure on a Thermally Labile Substrate

In another aspect of the invention, provided herein a method for fabricating a 3D nano-structure bound to a thermally labile substrate, comprising:
 a. forming a template by contacting the thermally labile substrate with a polymer, wherein the polymer comprises reacting sites for one or more material precursor, thereby forming the template;
 b. exposing the template with the one or more material precursor for a time period sufficient to bind the one or more material precursor with at least a portion of the reacting sites, thereby forming a complex;
 c. oxidizing the complex; and
 d. repeating steps b and c n times, wherein n is between 0 and 100;

wherein steps a to d are performed at a temperature compatible with the thermally labile substrate, thereby fabricating the 3D nano-structure bound to the thermally labile substrate. In some embodiments, the method comprises passivation step prior to performing the step a.

In some embodiments, the method comprises performing passivation step on a thermally labile substrate; performing steps a-d as described herein, thereby obtaining a patterned 3D nano-structure on the thermally labile substrate.

Without being limited to any specific value, the method of making a 3D nano-structure bound to a thermally labile substrate in any embodiment thereof, is performed at a temperature less than 90° C., less than 85° C., less than 80° C., less than 75° C., less than 70° C., less than 60° C., less than 50° C.

In some embodiments, provided herein a method for fabricating a 3D nano-structure on a substrate, comprising:
- a. forming a template by contacting the substrate with a polymer, wherein the polymer comprises reacting sites for one or more material precursor, thereby forming the template;
- b. exposing the template with the one or more material precursor for a time period sufficient to bind the one or more material precursor with at least a portion of the reacting sites, thereby forming a complex;
- c. oxidizing the complex; and
- d. repeating steps b and c n times, wherein n is between 0 and 100;

thereby fabricating the 3D nano-structure bound to the substrate. In some embodiments, the method comprises passivation step prior to performing the step a. In some embodiments, steps a to d are performed at a temperature compatible with the substrate. In some embodiments, compatible temperature is referred to a temperature at which the substrate maintains its function and/or maintains its structural intactness. In some embodiments, structural intactness is as described herein. It should be apparent, that while the method of the invention in some embodiments thereof, provides advantageous manufacturing conditions so as to form a 3D nano-structure on a thermally labile substrate, the conditions of the method described hereinbelow can be applied to any substrate (such as a thermally stable substrate, as well as to a thermally labile substrate).

Template Formation on a Thermally Labile Substrate

In some embodiments, the method comprises performing a pretreatment of the substrate, wherein the substrate is a thermally labile substrate. In some embodiments, pretreatment comprises performing a passivation step on the thermally labile substrate. In some embodiments, passivation comprises: (i) exposing the thermally labile substrate with a material precursor; (ii) performing oxidation step c; and optionally repeating steps (i) and (ii) n times, wherein n is between 1 and 100.

In some embodiments, passivation comprises: (i) exposing the thermally labile substrate with a material precursor for a time sufficient for binding or adsorbing of material precursor to at least a part of the thermally labile substrate. In some embodiments, step (i) comprises exposure time between 0.01 and 10 seconds (s), between 0.01 and 1 s, between 0.01 and 0.02 s, between 0.02 and 0.05 s, between 0.05 and 0.1 s, between 0.1 and 0.2 s, between 0.2 and 0.5 s, between 0.5 and 1 s, between 1 and 2 s, between 2 and 5 s, between 5 and 10 s, including any range therebetween.

In some embodiments, step (i) is for binding or adsorbing the material precursor onto the thermally labile substrate.

In some embodiments, the step (i) is repeated n times, wherein n is between 1 and 400, between 1 and 50, between 50 and 100, between 100 and 200, between 200 and 400 including any range therebetween.

In some embodiments, passivation comprises step (ii) of oxidizing the material precursor in contact (e.g. bound or adsorbed) on or within the substrate. In some embodiments, oxidizing is as described herein. In some embodiments, the passivation step is forming a barrier layer on top of the thermally labile substrate. In some embodiments, the barrier top layer is impermeable to a material precursor, wherein the material precursor is as described herein. In some embodiments, the barrier top layer comprises the metal oxide.

In some embodiments, the barrier top layer is between 1 and 100 nm, between 1 and 30 nm, between 1 and 10 nm, between 10 and 30 nm, between 30 and 50 nm, between 50 and 70 nm, between 70 and 100 nm, thick. In some embodiments, passivation step is for maintaining an organized structure of the self-assembled polymeric blocks in the template, wherein the template is as described above.

Without being bound to any theory or mechanism, it is postulated that passivation step induces passivation of the reactive sites on the surface of the thermally labile substrate, thereby preventing disassembly of the self-assembly of the organized polymeric domains within the template. As exemplified by FIGS. 7A-C, exposing the polymer substrate to the organometallic precursors prior to the template layer fabrication maintains the self-assembly of the block-co-polymer based template.

In some embodiments, step a comprises contacting a thermally labile substrate with a polymer under conditions compatible with the thermally labile substrate. In some embodiments, the method comprises step a of template formation. In some embodiments, step a comprises contacting a thermally labile substrate with a polymer. In some embodiments, step a results in formation of a polymeric layer bound to a thermally labile substrate. In some embodiments, step a is performed at a temperature compatible with a thermally labile substrate.

In some embodiments, provided herein a method of forming a multi-layer template. In some embodiments, the method of forming the multi-layer template comprises a method of forming a first polymeric layer, a method of forming a second polymeric layer and wherein the method is performed at a temperature compatible with a thermally labile substrate.

In some embodiments, compatible is substantially maintaining a structural intactness of the thermally labile substrate. The terms "substantially" and "structural intactness" are as described herein above.

In some embodiments, the method of forming a first polymeric layer comprises contacting a thermally labile substrate with a first polymer, to obtain a first polymeric layer bound to a thermally labile substrate. In some embodiments, the method of forming a second polymeric layer comprises contacting a thermally labile substrate with a second polymer, to obtain the multi-layer template comprising a first polymeric layer and a second polymeric layer.

In some embodiments, the method of forming the first polymeric layer is by applying a first polymer to a thermally labile substrate by a method selected from the group comprising: spin casting, spin coating, dip coating, blade coating, roll to roll processes, or any combination thereof. In some embodiments, the method of forming the first polymeric layer further comprises curing. In some embodiments, curing is performed by UV-crosslinking.

In some embodiments, the method of forming the second polymeric layer is by applying a second polymer to the first polymeric layer, thereby obtaining the second polymeric layer bound to the first polymeric layer. In some embodiments, a second polymer is applied as described herein above.

The terms "crosslinked" and "UV curing" are as described herein above.

In some embodiments, upon forming the second polymeric layer, a second polymer is converted into an organized structure.

In some embodiments, a second polymer is converted into an organized structure by solvent vapor annealing. In some embodiments, solvent vapor annealing allows a spontaneous self-assembly of the second polymeric layer into an organized structure.

As used herein, "organized structure" is as described herein above.

As used herein, "solvent vapor annealing", relates to a process in which a polymeric layer is exposed to vapors of one or more solvents, at temperatures typically well below the melting point of the polymer, to form a swollen and mobile polymer film atop the substrate. On subsequent solvent evaporation, polymer chains can form a plurality of well-organized nanostructures (e.g. structurally ordered polymeric blocks).

The process of solvent vapor annealing provides a sufficient mobility to the second polymer, to facilitate a self-assembly of the second polymer into the highly order structure in the equilibrium state. This process is not restricted to a particular solvent and can be performed at an ambient temperature, thus being compatible with thermally labile substrate.

In some embodiments, solvent vapor annealing is performed for a time period sufficient to induce self-assembly of the second polymer. In some embodiments, self-assembly comprises forming a plurality of structurally ordered domains, as described herein. In some embodiments, the time period for solvent vapor annealing is between 0.5 and 5 h, between 0.5 and 1 h, between 1 and 1.5 h, between 1.5 and 2 h, between 2 and 2.5 h, between 2.5 and 3 h, between 3 and 3.5 h, between 3.5 and 4 h, between 4 and 5 h, between 1.5 and 3.5 h, between 2.5 and 3.5 h, between 2 and 3 h, or any range or value therebetween.

In some embodiments, the time period for solvent vapor annealing is at least 1.5 h, at least 2 h, at least 2.5 h, at least 3 h, including any range or value therebetween.

In some embodiments, the method for template formation is performed at a temperature less than 90° C., less than 85° C., less than 80° C., less than 75° C., less than 70° C., less than 60° C., less than 50° C.

In some embodiments, the first and the second polymers are applied to thermally labile substrate at a temperature less than 90° C., less than 85° C., less than 80° C., less than 75° C., less than 70° C., less than 60° C., less than 50° C.

In some embodiments, solvent vapor annealing is performed at a temperature less than 90° C., less than 85° C., less than 80° C., less than 75° C., less than 70° C., less than 60° C., less than 50° C.

In some embodiments, solvent vapor annealing is performed at a temperature in a range from 50 to 90° C., from 60 to 90° C., from 60 to 85° C., from 50 to 85° C., from 70 to 90° C., from 70 to 85° C., from 70 to 82° C., from 60 to 82° C., from 50 to 82° C., from 50 to 82° C., from 75 to 85° C., from 75 to 82° C., including any range or value therebetween.

In some embodiments, the step of template formation and subsequent steps of the method are performed at a temperature compatible with the thermally labile substrate. In some embodiments, subsequent steps of the method are performed at a temperature and exposure time compatible with the template, wherein compatible is as described hereinbelow.

In some embodiments, compatible temperature is referred to a temperature which doesn't induces structural deformation and/or cracking of the substrate. In some embodiments, compatible temperature is referred to a temperature which doesn't induces layer separation of the multi-layered thermally labile substrate. In some embodiments, the steps of the method are performed under conditions compatible with the thermally labile substrate. In some embodiments, the thermally labile substrate remains stable (e.g., retains its structural integrity as described herein) under conditions of the method, wherein the conditions comprise exposure time and temperature.

In some embodiments, the thermally labile substrate loses its stability and/or its function upon exposure to a temperature above 80° C., above 100° C., above 150° C., above 200° C., above 250° C., including any range or value therebetween.

In some embodiments, a thermally labile substrate comprises a polymeric substrate, wherein the polymeric substrate comprises any polymer. In some embodiments, a thermally labile substrate comprises a polymeric substrate in contact with an additional substrate (e.g. Si, $SiO_2$). In some embodiments, the polymeric substrate comprises an organic polymer and optionally an inorganic polymer. In some embodiments, the polymeric substrate comprises a polymer having a melting point of less than 250° C., less than 200° C., less than 150° C., less than 100° C., less than 90° C., including any range or value therebetween.

In some embodiments, the thermally labile substrate comprises a plurality of layers. In some embodiments, the thermally labile substrate comprises a multi-layered substrate, wherein at least two layers are characterized by different expansion coefficients.

In some embodiments, a thermally labile substrate is selected from the group comprising: a thermally labile polymer, and a multi-layer substrate.

In some embodiments, the thermally labile substrate is a thermally labile polymer. In some embodiments, the thermally labile substrate comprises a thermally labile polymer bound to a $SiO_2$ layer. In some embodiments, thermally labile substrate comprises the $SiO_2$ layer bound to or in contact with at least a portion of the thermally labile polymer.

In some embodiments, the thermally labile polymer comprises an organic polymer characterized by a melting temperature of less than less than 90° C., less than 85° C., less than 82° C., less than 80° C., less than 78° C., less than 75° C., less than 70° C., less than 60° C., less than 50° C. including any range or value therebetween.

Non-limiting examples of thermally labile polymers include, but are not limited to: polycarbonate (PC), allyl diglycol carbonate, very low-density polyethylene (VLDPE), polyester, polyamide, polyethylene glycol (PEG), polyethylene terephthalate (PET), polyvinyl chloride (PVC), polyacrylate, polyolefin, polymethyl methacrylate (PMMA), poly(2-hydroxyethyl methacrylate) (pHEMA), and nylon, polycaprolactone (PCL), polylactic acid (PLA), polyglycolic acid, polylactic-co-glycolic acid (PLGA), polyethylene-vinyl acetate, polypropylene-carbonate, polyethylene-co-methacrylate, and polyurethane, including any combination or a copolymer thereof. Other non-limiting examples of thermally labile polymers may include polymers used in fabrication of optical lenses, such as MR-material (MR-6, MR-8, MR-7, MR-10), and allyl diglycol carbonate (CR-39). Other thermally labile polymers are well-known in the art.

In some embodiments, the thermally labile substrate is a multi-layer substrate, wherein at least one layer has a different thermal expansion coefficient. In some embodiments, the multi-layer substrate undergoes deformation upon exposure to an elevated temperature. In some embodiments, the thermally labile substrate is devoid of an inorganic polymer. In some embodiments, the thermally labile polymer is devoid of inorganic material (e.g., metal oxide, silica etc.).

In some embodiments, the thermally labile substrate partially loses its structural intactness and tensile strength upon exposure to an elevated temperature. In some embodiments, the thermally labile substrate partially loses its functional properties upon exposure to an elevated temperature.

In some embodiments, at least 1%, at least 5%, at least 10%, at least 15%, at least 20%, at least 30%, at least 40%, at least 50% w/w of the thermally labile substrate undergoes deformation upon exposure to an elevated temperature.

In some embodiments, an elevated temperature is a temperature above 80° C., above 82° C., above 85° C., above 90° C., above 95° C., above 100° C., above 150° C., above 200° C., above 250° C., above 300° C., or any range or value therebetween.

In some embodiments, the template comprises the thermally labile substrate bound to a polymeric layer. In some embodiments, the template is a multi-layer template, comprising the thermally labile substrate bound to the first polymeric layer and to the second polymeric layer, wherein the first polymeric layer and the second polymeric layer are as described herein above.

3D Nano-structure Formation on a Thermally Labile Substrate

According to some embodiments, the present invention provides a method for fabricating a 3D nano-structure in contact with or bound to the thermally labile substrate. In some embodiments, the method comprises exposing the template with one or more material precursors for a time period sufficient to bind a material precursor with at least a portion of the reacting sites, thereby forming a complex. In some embodiments, the method is performed at a temperature compatible with the thermally labile substrate, as described above.

According to some embodiments, the present invention provides a method for fabricating a 3D nano-composite comprising a plurality of materials bound to the thermally labile substrate. In some embodiments, the method is performed at a temperature compatible with the thermally labile substrate. In some embodiments, the plurality of materials are inorganic materials.

The steps b-d of the method for fabricating a 3D nano-structure and/or a 3D nano-composite are performed, as described herein above.

As used herein, the terms "nano-structure", and "nano-composite" refer to materials, the building blocks of which have a nanometric size. Generally speaking, any material that contains domains or particles with a size of 1 nm to 1000 nm (nanometers) across, or layers or filaments of that thickness, can be considered a nanostructured material. More particularly, a "composite" is a matrix composed of two or more inorganic materials (e.g. metal oxide). A nano-structure may be related to a 3D structure composed of two or more inorganic materials, or it may be related to a homogenous 3D structure composed of a single inorganic material. In some embodiments, the nano-structure is related to the inorganic 3D structure immersed within or bound to the template.

Etching

In some embodiments, the method further comprises a first etching step e. In some embodiments, step e. is for removing at least a portion of the template. In some embodiments, step e. is for removing at least a portion of the organic polymer. In some embodiments, step e is for removing at least a portion of the second polymer. In some embodiments, step e. comprises removing 1% to 100%, 1% to 99%, 1% to 98%, 1% to 95%, 1% to 90%, 1% to 80%, 1% to 70%, 1% to 60%, 1% to 50%, 5% to 100%, 10% to 100%, 5% to 50%, 5% to 99%, 10% to 99%, 10% to 95%, 10% to 80%, 5% to 80%, or 5% to 98% of the second polymer, including any range therebetween.

In some embodiments, after removing at least a portion of the second polymer an inorganic 3D nano-structure is left. In some embodiments, a 3D nano-structure retains its configuration upon removal of at least a portion of the template. In some embodiments, a 3D nano-structure is a 3D nano-composite.

In some embodiments, the first etching step is performed at a temperature compatible with the thermally labile substrate.

In some embodiments, the first etching step is performed at a temperature less than 90° C., less than 85° C., less than 80° C., less than 75° C., less than 70° C., less than 60° C., less than 50° C.

In some embodiments, the first etching step is performed at a temperature in a range from 50 to 90° C., from 60 to 90° C., from 60 to 85° C., from 50 to 85° C., from 70 to 90° C., from 70 to 85° C., from 70 to 82° C., from 60 to 82° C., from 50 to 82° C., from 50 to 82° C., from 75 to 85° C., from 75 to 82° C., including any range or value therebetween.

In some embodiments, the first etching step comprises dry etching. In some embodiments, the first etching step is selected form the group comprising: plasma etching, heat treatment and UV-ozone exposure. In some embodiments, plasma etching is $O_2$ plasma etching.

As used herein, the term "plasma etching" relates to a process for removal an organic matter (e.g. block-copolymer) from the substrate by bombarding the surface of the substrate with gas plasma containing partially ionized atomic species.

As used herein, the term "UV-ozone exposure" relates to a process for removal an organic matter (e.g. block-copolymer) from the substrate by generating reactive oxygen species, which react with the organic matter, thereby converting it to volatile byproducts such as $CO_2$, $H_2O$ and $O_2$. These volatile species are subsequently removed from the surface by applying vacuum.

As used herein, the term "heat treatment" relates to a process for removal an organic matter (e.g. block-copolymer) from the substrate surface by applying heat thereto, thereby evaporating the organic matter. In some embodiments, heat treatment comprises heat treatment in a furnace under conditions (e.g., at a temperature sufficient for evaporating the block-copolymer). In some embodiments, heat treatment is by infrared (IR) heating. In some embodiments, heat treatment is by microwave heating.

Figure 2:
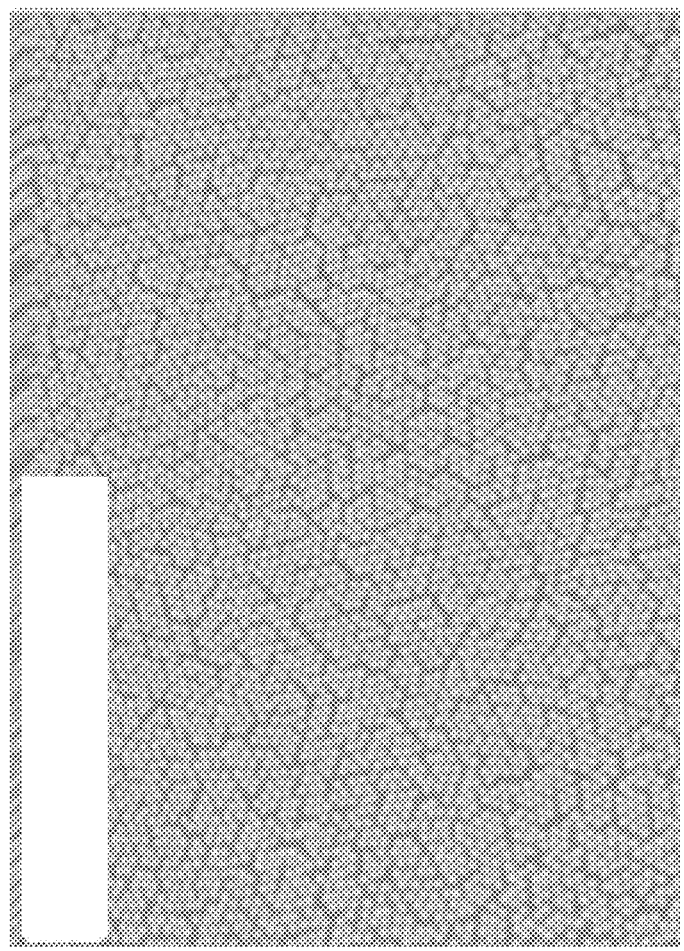
FIG. 2 represents a SEM image showing a patterned 3D nano-structure manufactured by sequential infiltration synthesis (SIS) process, and after performing a plasma etching step.

A SEM image of a 3D nano-composite after performing a plasma etching step is represented by FIG. 2. As shown in FIG. 2, a highly periodic inorganic 3D nanostructure is obtained.

In some embodiments, the 3D nano-structure maintains substantially its configuration after removal of at least a portion of the template. In some embodiments, the 3D nano-structure maintains 30% to 100%, 50% to 100%, 50% to 99%, 50% to 98%, 70% to 100%, 80% to 100%, 80% to 99%, 80% to 98%, 90% to 100%, 90% to 99%, or 90% to 95% of its configuration after removal of at least a portion of the template, including any range therebetween.

In some embodiments, the 3D nano-structure maintains substantially its structure after removal of at least a portion of the template, wherein "substantially" is as described herein above. In some embodiments, the 3D nano-structure maintains substantially its structure and the configuration after performing the first etching step.

In some embodiments, the method further comprises a second etching step f. In some embodiments, the second etching step is performed at a temperature compatible with the thermally labile substrate. In some embodiments, the second etching step is performed at a temperature less than 90° C., less than 85° C., less than 80° C., less than 75° C., less than 70° C., less than 60° C., less than 50° C.

In some embodiments, the second etching step is performed at a temperature in a range from 50 to 90° C., from 60 to 90° C., from 60 to 85° C., from 50 to 85° C., from 70 to 90° C., from 70 to 85° C., from 70 to 82° C., from 60 to 82° C., from 50 to 82° C., from 50 to 82° C., from 75 to 85° C., from 75 to 82° C., including any range or value therebetween.

In some embodiments, the second etching step comprises reactive ion etching (RIE). In some embodiments, RIE is performed to remove at least a portion of the plurality of materials. In some embodiments, RIE is performed to remove at least a portion of the inorganic material of the 3D nano-structure. In some embodiments, RIE is performed by using a RIE agent selected from the group comprising: $CHF_3$, $Cl_2$, $O_2$, $CF_4$, $CF_3Br$, $SF_6$, and HBr or any combination thereof.

As used herein, "reactive ion etching" (RIE) is related to a process of dry chemical etching, by using chemically reactive plasma to at least partially remove inorganic material deposited on a substrate.

In some embodiments, the plurality of materials within the 3D nano-structure is organized in a plurality of layers. In some embodiments, an upper layer comprises a material which is stable to RIE. In some embodiments, a bottom layer comprises a material which is labile to RIE. In some embodiments, the upper layer comprising a material which is stable to RIE, forms a masking layer. In some embodiments, the masking layer reduces a RIE induces degradation of the bottom layer by.

In some embodiments, RIE removes at least a portion of any of the plurality of materials. In some embodiments, RIE removes at least a portion of any of the first material and of the second material. In some embodiments, RIE removes selectively at least a portion of an unmasked material. In some embodiments, an unmasked material is devoid of the masking layer. In some embodiments, the masking layer comprises $Al_2O_3$. In some embodiments, the substrate remains untouched by the RIE agent.

In some embodiments, RIE etching results in a 3D nano-structure with a high aspect ratio, as described herein below. In some embodiments, RIE etching results in a 3D nano-structure which retains the configuration of the 3D nano-structure after the first etching step. In some embodiments, RIE etching results in a 3D nano-structure which retains the configuration of the template. In some embodiments, the 3D nano-structure retains the pattern of the block copolymer.

In some embodiments, the method of the invention comprising the second etching step is devoid of the first etching step. In some embodiments, the second etching step removes at least a portion of the template and at least a portion of any of the plurality of materials.

In some embodiments, the 3D nano-structure maintains substantially its structure after removal of at least a portion of the plurality of materials, wherein "substantially" is as described herein above. In some embodiments, the 3D nano-structure maintains substantially its structure and the configuration after performing the second etching step.

RIE etching conditions and etch time may be adjusted to control the height (e.g. a depth that the plasma etches into the bottom layer) and the profile of the 3D nano-structure. The effect of RIE time on the height of the 3D nano-structure is exemplified by FIG. 3.

3D Nanostructure

According to some embodiments, the present invention provides a 3D nano-structure. In some embodiments, provided herein a 3D nano-composite comprising the plurality of materials. In some embodiments, provided herein the 3D nano-structure and/or 3D nano-composite prepared according to the method of the present invention, as described herein.

In some embodiments, the plurality of materials are inorganic materials.

In some embodiments, an inorganic material comprises a metal, a metal oxide, or a combination thereof. In some embodiments, the 3D nano-structure is bound to at least a portion of the template. In some embodiments, the 3D nano-structure is partially incorporated within the template.

In some embodiments, the 3D nano-structure is structurally ordered. In some embodiments, the 3D nano-structure is characterized by a spatial orientation.

According to some embodiments, the present invention provides the 3D nano-structure comprising the plurality of materials, as described herein above. In some embodiments, the 3D nano-structure is devoid of the template.

Figure 4:
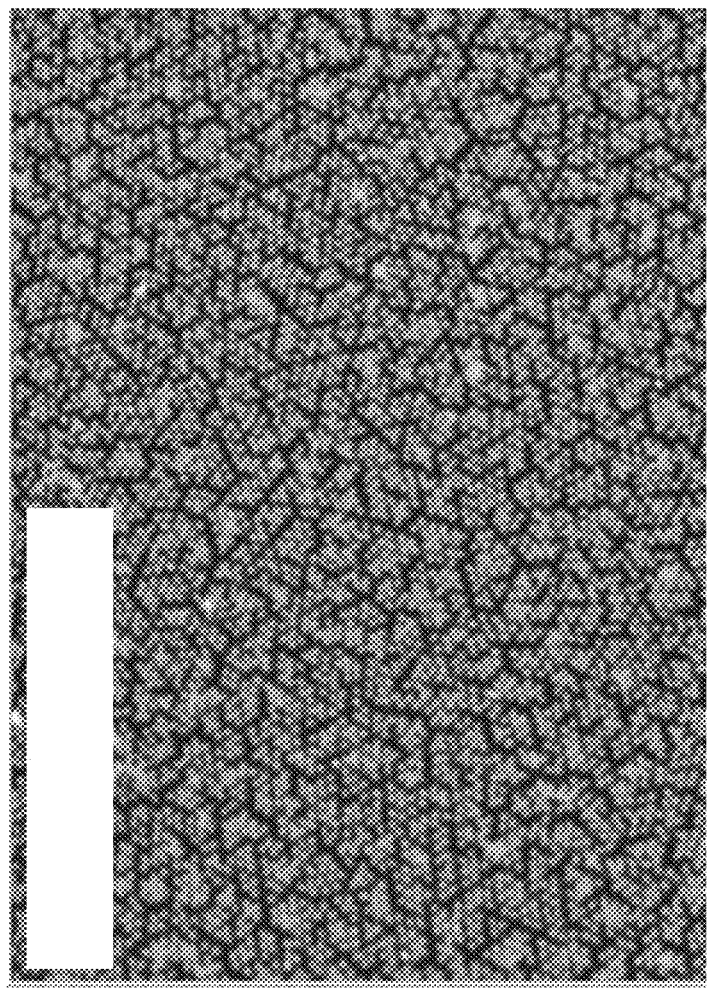
FIG. 4 represents a SEM image showing a patterned 3D nano-structure after plasma etching and RIE (7 min) steps.

A SEM image of an exemplary 3D nano-structure after two etching steps is represented by FIG. 4.

In some embodiments, the plurality of materials are arranged in separate consecutive layers so as to form a 3D nano-composite. In some embodiments, the plurality of materials are mixed together so as to form a single-layer 3D nano-composite.

In some embodiments, the 3D nano-composite comprises a first bottom layer formed by a first material, and a second top layer formed by a second material. In some embodiments, a first material forms a first layer on top of the layer of a second material. In some embodiments, the 3D nano-composite further comprises a third layer formed by a third material, on top of the second layer.

In some embodiments, the 3D nano-structure comprises a first layer formed by a first material, a second layer formed by a second material, and a third layer formed by a mixture of a first material and a second material, wherein any of the first material, the second material, and the third material are inorganic materials. In some embodiments, the inorganic material is as described herein above.

In some embodiments, the 3D nano-structure comprises a first layer comprising a mixture of a first material and a second material, and a third layer comprising a third material.

In some embodiments, the plurality of inorganic materials comprises the metal and/or metal oxide, as described herein above.

The location of the inorganic material within the 3D nano-structure is defined by two factors:
  the location in x-y plane, which is defined by the template geometry and chemistry, i.e. exact spatial orientation of the reacting sites; and
  the location in z plane, which is defined by the diffusion length of the material precursors into the polymer. The diffusion into the polymer is defined by the diffusion time and the diffusion coefficient of the precursor into the polymer. The location of the metallic material in the x-y plane can also be controlled by a number of repeating cycles. Additionally, a spatial distribution pattern of the plurality of materials within the 3D nano-structure can be controlled by adjusting the diffusion time and the number of repeating cycles. The spatial distribution pattern is a spatial distribution and/or final location of any of the materials composing the 3D nano-composite.

In some embodiments, the spatial distribution pattern of the 3D nano-composite comprises the plurality of materials arranged in separate consecutive layers. In some embodiments, the plurality of materials are arranged into an alternating pattern (e.g. chessboard like pattern).

In some embodiments, the 3D nano-composite is devoid of the spatial distribution pattern, comprising the plurality of materials mixed together so as to form a homogenous structure.

As used herein the term "diffusion coefficient" refers to the rate by which a substance or material diffuses into a substrate.

As used herein the term "diffusion time" refers to a time period the template was exposed to any of the plurality of material precursors. The terms "diffusion time" and "time period" are used herein interchangeably.

According to some embodiments, the final location of any of the plurality of materials within the 3D nano-structure is controlled. In some embodiments, the final location of the first material and the second material within the 3D nano-structure is controlled by controlling the diffusion time of the first material precursor and the second material precursor.

In some embodiments, the diffusion length and the final location of the material precursor is determined by its diffusion time. In some embodiments, the diffusion length is more than 0.

In some embodiments, the diffusion length and the final location of the first material precursor is determined by the first time period. In some embodiments, the diffusion length and the final location of the second material precursor is determined by the second time period.

In some embodiments, the diffusion length and the final location of any of the plurality of materials is determined by the order of the sequential exposure of the template with the plurality of material precursors.

In some embodiments, a spatial distribution pattern of the material precursor is controlled by any of the diffusion time, number of n times, and the order of the sequential exposure. In some embodiments, the direction in which a material precursor diffuses in the template, determines the final location of the material. In some embodiments, the template has only one possible diffusion direction. In some embodiments, the template comprises multiple diffusion directions. In some embodiments, a template comprising one diffusion direction leads to a layered 3D nano-composite. In some embodiments, a template comprising multiple diffusion directions leads to a core-shell like 3D nano-composite.

Figure 5A:
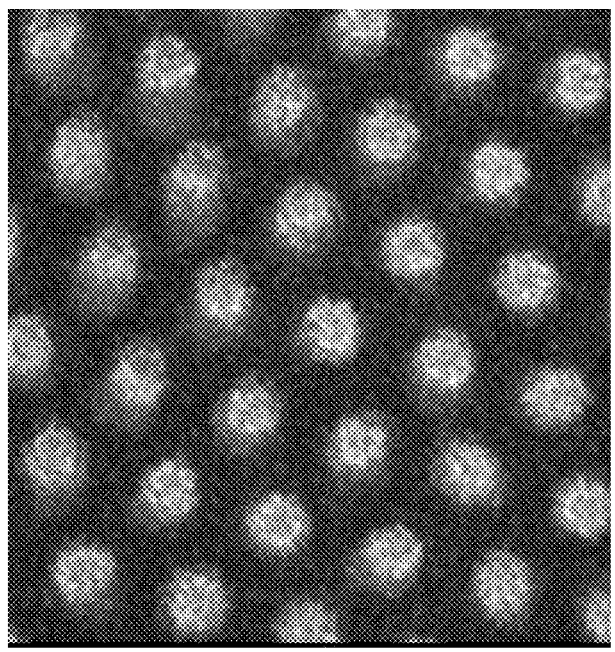
FIG. 5A represents top down STEM image.
Figure 5B:
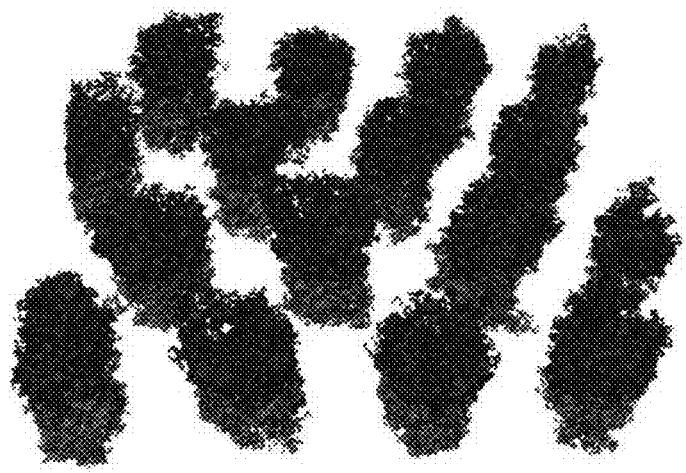
FIG. 5B represents 3D visualization of the EDS tomography showing zinc oxide layer on top of aluminum oxide layer.
Figure 6B:
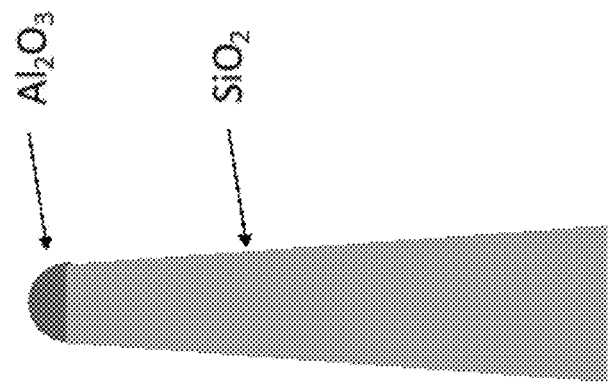
FIG. 6B represents an illustration of a rod composed of $SiO_2$ with top $Al_2O_3$ layer. The illustrated positions of $Al_2O_3$ and $SiO_2$ are indicated by arrows.
Figure 6A:
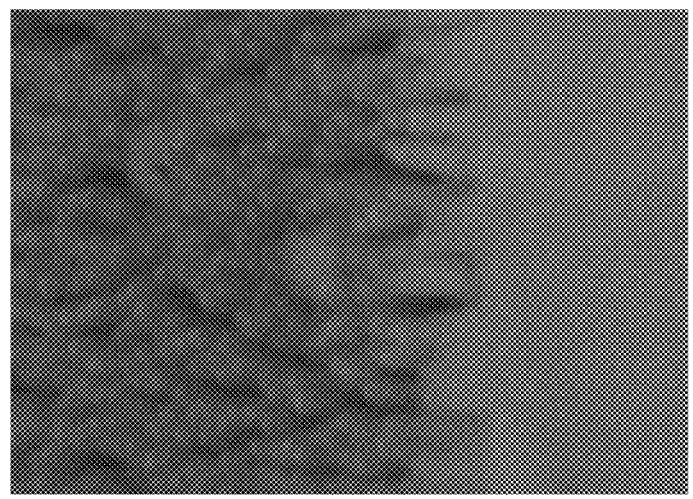
FIG. 6A is an image of a 3D nano-structure having a pattern of nano-rods composed of $Al_2O_3$ tip and $SiO_2$ rod.

In some embodiments, the time period is adjusted so as to control an aspect ratio of the layered 3D nano-structure. Furthermore, by varying the n times the steps b and c are repeated, an optimal separation between the layers within the layered 3D nano-structure can be achieved (as exemplified by FIG. 5).

As used herein, the term "core-shell" refers to an onion-like structure having a central core surrounded by one or more concentric shell layers.

In some embodiments, the 3D nano-structure is characterized by a spatial orientation. In some embodiments, the 3D nano-structure adopts a spatial orientation and/or a pattern of the template. In some embodiments, at least a part of the 3D nano-structures adopts a spatial orientation and/or a pattern of the template. In some embodiments, the spatial orientation of the template is characterized by the spatial orientation and/or the pattern of polymeric blocks, as described herein.

In some embodiments, the 3D nano-structure comprises a plurality of arrays. In some embodiments, a plurality of arrays is organized in a pattern. In some embodiments, the pattern comprises a plurality of geometric forms. In some embodiments, the pattern comprises any geometric form that can be patterned on a surface.

In some embodiments, the 3D nano-structure comprises a plurality of aligned geometrical forms. In some embodiments, the 3D nano-structure comprises a plurality of aligned cylinders. In some embodiments, the 3D nano-structure comprises a plurality of aligned rods. In some embodiments, at least a part of aligned rods adopts a vertical orientation.

In some embodiments, the 3D nano-structure or 3D nano-composite comprises a plurality of vertically aligned rods.

In some embodiments, the plurality of vertically aligned rods is characterized by a rod diameter which is almost equal to the diameter of plurality of vertically aligned cylinders of the second polymeric layer. In some embodiments, the rod diameter is in a range of 5 nm to 500 nm. In some embodiments, the rod diameter is in a range from 5 nm to 300 nm, 5 nm to 200 nm, 5 nm to 400 nm, 5 nm to 200 nm, 5 nm to 100 nm, or 5 nm to 50 nm, including any range therebetween. In some embodiments, an average diameter of the plurality of rods is in the range of 5 nm to 10 nm, 10 nm to 30 nm, 15 nm to 30 nm, 20 nm to 25 nm, 25 nm to 30 nm, 30 nm to 40 nm, 40 nm to 50 nm, 10 nm to 50 nm, 50 nm to 70 nm, 70 nm to 100 nm, 100 nm to 150 nm, 150 nm to 200 nm, 200 nm to 300 nm, 300 nm to 400 nm, 400 nm to 500 nm, 500 nm to 600 nm, 600 nm to 700 nm, 700 nm to 900 nm, 5 nm to 900 nm, 5 nm to 500 nm, 5 nm to 300 nm, 5 nm to 200 nm, 5 nm to 900 nm, 5 nm to 500 nm, 5 nm to 200 nm, 5 nm to 100 nm, 5 nm to 50 nm, including any range or value therebetween.

In some embodiments, a stable 3D nano-structure or 3D nano-composite comprises nano rods having a rod diameter of at least 5 nm.

In some embodiments, the plurality of rods within the 3D nano-structure or the 3D nano-composite is characterized by a height. In some embodiments, the height is a mean height of the plurality of vertically aligned rods. In some embodiments, the height in a range of 10 nm to 1 µm. In some embodiments, the height is in a range of 10 nm to 900 nm, 10 nm to 700 nm, 10 nm to 500 nm, 10 nm to 200 nm, 100 nm to 300 nm, 200 nm to 300 nm, or 10 nm to 100 nm, of 10 nm to 900 nm, 100 nm to 900 nm, 200 nm to 900 nm, 300 nm to 900 nm, 400 nm to 900 nm, 10 nm to 100 nm, 100 nm to 200 nm, 200 nm to 300 nm, 300 nm to 400 nm, 400 nm to 500 nm, 500 nm to 600 nm, 600 nm to 900 nm, 900 to 1000 nm, 10 nm to 500 nm, 10 nm to 200 nm, or 10 nm to 100 nm, including any range therebetween. In some embodiments, the height is substantially equal to the thickness of the template.

In some embodiments, an average distance between the rods within the 3D nano-structure or within the 3D nano-composite is between 5 and 100 nm, between 5 and 10 nm, between 10 and 20 nm, between 20 and 30 nm, between 20 and 40 nm, between 25 and 40 nm, between 30 and 40 nm, between 40 and 50 nm, between 50 and 60 nm, between 60 and 70 nm, between 70 and 80 nm, between 80 and 100 nm, including any range or value therebetween. In some embodiments, an average distance between the rods within the 3D nano-structure or within the 3D nano-composite is predetermined by the template. In some embodiments, an average distance between the rods within the 3D nano-structure or within the 3D nano-composite is predetermined by an average distance between the cylinders of the template, as described hereinabove.

In some embodiments, the 3D nano-structure or the 3D nano-composite is characterized by a height. In some embodiments, the height of the 3D nano-structure or the 3D nano-composite is a mean height of the plurality of vertically aligned rods.

In some embodiments, the height of the 3D nano-structure or the 3D nano-composite after two etching steps is greater than the height of the 3D nano-structure or of the 3D nano-composite after one etching step. In some embodiments, the height of the 3D nano-structure or of the 3D nano-composite after the first and the second etching steps is greater than the height of the 3D nano-structure or of the 3D nano-composite after the first etching step, wherein the first and the second etching steps are as described herein above.

In some embodiments, the 3D nano-structure after two etching steps is characterized by an enhanced aspect ratio, as compared to the 3D nano-structure after the first etching step. In some embodiments, the 3D nano-structure or the 3D nano-composite after two etching steps is characterized by an aspect ratio in a range of 1:1 to 1:10, of 1:1 to 1:2, of 1:2 to 1:4, of 1:4 to 1:6, of 1:6 to 1:8, of 1:8 to 1:10.

As used herein, the term "aspect ratio" is related to a ratio of the rod height to the rod diameter within the 3D nano-structure comprising a plurality of vertically aligned rods.

In some embodiments, a first material comprising a first metal and a second material comprising a second metal do not interact with each other. In some embodiments, a first material comprising a first metal and a second material comprising a second metal interact via metal-metal interactions, electron-electron interactions, ion-ion interactions, hydrogen bonds, electrostatic interactions, or any combination thereof.

According to some embodiments, the present invention provides an article comprising a 3D nano-composite and/or the 3D nanostructure, as described herein. In some embodiments, the article is a semi-conductor.

In some embodiments, the 3D nano-composite and/or the 3D nanostructure of the invention is a part of a coating, an outer layer, an inner layer or any combination thereof. In some embodiments, the coating is an anti-reflective coating, anti-abrasive coating, an anti-fouling coating, an anti-corrosion coating, a heat resistant coating, a chemical resistant coating, a superhydrophobic coating, a lyophobic coating or any combination thereof. In some embodiments, the coating is in contact with or bound to an outer surface of the article.

Non-limiting examples of articles according to the present invention include optical lenses, optical devices, microelectronic devices, microelectromechanical devices, and medical devices.

In some embodiments, the article comprising the 3D nano-structure or the 3D nano-composite of the invention is characterized by an enhanced abrasive strength. In some embodiments, the article is characterized by an increased durability. In some embodiments, the article comprising the 3D nanostructure or the 3D nano-composite is characterized by a reduced surface reflectance. In some embodiments, the initial surface reflectance of the article is reduced by the 3D nanostructure or the 3D nano-composite bound thereto. In some embodiments, the coating layer (e.g. the 3D nano-structure or the 3D nano-composite) transmits at least 50% of visible light, wherein visible light is as described hereinbelow. In some embodiments, the coating layer transmits at least 60%, at least 70%, at least 80%, at least 90%, or at least 95%, of visible light, including any value therebetween. In some embodiments, the coating layer transmits 50% to 100%, 50% to 98%, 50% to 95%, 50% to 90%, 50% to 85%, 50% to 80%, 50% to 75%, 50% to 70%, 60% to 100%, 60% to 98%, 60% to 95%, 60% to 90%, 60% to 85%, 60% to 80%, 60% to 75%, or 60% to 70%, of visible light, including any range therebetween.

In some embodiments, the reflectance (e.g. surface reflectance) is reduced by at least 10%, at least 20%, at least 30%, at least 40%, at least 50%, at least 60%, at least 70%, at least 80%, at least 90%, at least 100%, at least 150%, at least 200%, at least 300%, at least 400%, at least 500%, at least 600%, at least 700%, or any value therebetween, wherein the reflectance is measured in the visible light range (such as between 400 and 700 nm, between 400 and 500 nm, between 500 and 600 nm, between 600 and 700 nm, including any range therebetween).

General

As used herein the term "about" refers to ±10%.

The terms "comprises", "comprising", "includes", "including", "having" and their conjugates mean "including but not limited to".

In the description and claims of the present application, each of the verbs, "comprise", "include" and "have" and conjugates thereof, are used to indicate that the object or objects of the verb are not necessarily a complete listing of components, elements or parts of the subject or subjects of the verb.

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict. The word "optionally" and the word "further" are used herein interchangeably.

The terms, film/films and layer/layers are used herein interchangeably. As used herein, the term "coat" refers to the combined layers disposed over the substrate, excluding the substrate, while the term "substrate" refers to the part of the composite structure supporting the disposed layer/coating. In some embodiments, the terms "layer", "film" or as used herein interchangeably, refer to a substantially uniform-thickness of a substantially homogeneous substance.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, pharmacological, biological, biochemical and medical arts.

Other terms as used herein are meant to be defined by their well-known meanings in the art.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub combination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

Examples

Reference is now made to the following examples, which together with the above descriptions illustrate some embodiments of the invention in a non-limiting fashion.

Materials

PS-b-PMMA copolymer (Mn=46.1k-b-21k, poly dispersity index=1.09) was purchased from Polymer Source, Inc. and used as received. Poly(styrene-r-methyl methacrylate-r-glycidyl methacrylate) containing ≈4 mol % of glycidyl methacrylate was synthesized by reversible addition fragmentation chain transfer polymerization with styrene mole fractions of 77% (PG-4 77%).

Polyacrylic acid (PAA) solution (Mw≈15 000 g/mol$^{-1}$, 35 wt % in water, sodium salt) was purchased from Sigma-Aldrich and used as received. Quartz monitor gold coated crystals (6 MHz) were purchased from Inficon.

Electron Microscopy

Top down and cross-sectional SEM images were performed using Zeiss Ultra-Plus High-Resolution SEM (Technion Center for Electron Microscopy of Soft Matter) The cross-sectional samples were imaged at 70° tilt following a dry breakage of the sample. Nanorod dimensions were measured from multiple identical samples using several locations in the same sample. The average dimensions and standard deviation were measured from at least 50-60 nanorods.

HAADF STEM imaging and tomography were performed with Thermo Fisher Talos 200C High-Resolution TEM (Technion Center for Electron Microscopy of Soft Matter) at 200 keV. STEM-EDS characterization and tomography were performed with Thermo Fisher Titan Cubed Themis G2 60-300 (Technion Electron Microscopy Center) at 200 keV. To obtain high Z contrast. HAADF-STEM tomography was performed with a camera length of 97 mm. A series of STEM images was acquired at tilt angles ranging from −66° to 66° at 2° intervals. HAADF-STEM-EDS tomography was performed with a camera length of 117 mm with data acquired at tilt angles ranging from −66° to 66° at 2° intervals. In each tilt angle, EDS maps of Al and Zn were recorded separately (in addition to HAADF-STEM image) using DualX1 and DualX2 detectors. Pixel size was set to 371.1 pm×371.1 pm. The focus in each tilt angle was adjusted automatically by the software.

The obtained image sequence was aligned using Inspect 3D software with iterative cross-correlations. Visualization of the reconstructed volume was performed using Affirm software.

Example 1

Template Formation

Three-dimensional nano patterns were fabricated on flat thermally stable substrates (Si, SiO$_2$). In an exemplary procedure, silicon wafers were cleaned three times with toluene and purged by nitrogen. A mat layer (PG4-77%) was spin cast from 0.3 wt % solution in toluene, followed by thermal annealing at 250° C. in nitrogen environment for 1 h. A thin layer of polymer mat was used for tuning the surface interactions of the substrate. The polymer mat was crosslinked by exposure to UV light in inert atmosphere, to obtain the first polymeric layer.

A self-assembled layer of PMMA cylinder forming PS-b-PMMA was fabricated by spin-casting from 2.5-3 wt % solutions in toluene on top of the mat layer, followed by thermal annealing at 230° C. in nitrogen environment for 3 h, resulting in 80-100 nm thick layer, thus forming the second polymeric layer.

The template was manufactured on a thermally labile substrate, according to the above described procedure, however the annealing temperature during the formation of the first polymeric layer was kept below 80° C.

For fabrication of the structured second polymeric layer on a thermally labile substrate. PS-b-PMMA was solvent annealed in a saturated Tetrahydrofuran (THF) environment at room temperature for 15 min, as described in the Example 3.

Example 2

Sequential Infiltration Synthesis (SIS)

3D heterostructures composed of Al$_y$O$_x$ and ZnO nanocylinders were fabricated by sequential infiltration of trimethyl aluminum (TMA) and diethyl zinc (DEZ) and water into PMMA domain of block copolymer (BPC) using a commercial ALD (Savannah S100, Veeco).

Sequential Infiltration Synthesis:

Samples were loaded into the ALD at 95 and were given at least 10 min for thermal stabilization before starting the process under 20 sccm $N_2$ flow at 0.3 Torr base pressure. When QCM was used, the stabilization period was extended to at least 2 h. The SIS process was performed in semi-static mode. Each SIS process included a cycle of $Al_yO_x$ pretreatment where only TMA and H2O precursors were used, followed by four cycles with TMA, DEZ, and H2O. The $Al_yO_x$ pretreatment cycles were composed from a sequence of TMA/purge/H2O/purge with TMA exposure of 400-600 s, followed by puree (450-700 s), H2O exposure (300-600 s), and purge (350-700 s). The next four cycles included first two steps of TMA/purge with exposure time of 10 and 100 s purge, this was repeated between 1 and 10 times in several processes.

When multi-materials SIS is desired, two metalorganic precursors are sequentially exposed with different exposure time. Short exposure time for the first and long exposure time for the second. Only then, the metalorganic precursors are oxidized to complete the SIS cycle.

For the fabrication of 3D heterostructures composed of $Al_yO_x$ and ZnO nano-cylinders, a step of DEZ/purge was performed once or twice with typical exposure time ranging between 180 and 600 s and a purge of 350-700 s.

The full SIS cycle, precursor 1/purge/precursor 2/purge is repeated several times. In each cycle the final step included a purge of an oxidizing or oxygenating agent such as $H_2O$ with typical exposure time of 300-600 s (and a purge of 350-700 s). Pressures during precursor exposures were ≈300-700 and 200-300 torr for TMA and DEZ, respectively, during which 5 sccm of $N_2$ were flowed into the chamber. During the purge, $N_2$ flow was 20 sccm.

Template Removal by $O_2$ Plasma Etching:

The polymeric template was removed using $O_2$ plasma with diener electronic Femto low pressure plasma system with the following parameters: 0.4±0.2 mbar gas pressure; 50%±5% power. The duration of plasma was 5 and 7 min for TEM grids and SEM silicon wafer samples, respectively. Minor organic residual may still be present in the final inorganic product.

Vertically aligned conical-shaped nano-rods are fabricated by etching the patterned metal oxide cylinders with reactive ion etching (RIE). An exemplary reagent suitable for RIE is a gaseous $CHF_3$.

Morphology of the sample is studied by high-resolution scanning electron microscope.

Example 3

Solvent Annealing on the Thermally Labile Substrate 100 ml of THF is stored in the solvent annealing chamber (a wide neck container with a cover lid) for one hour to achieve thermal equilibrium and saturation of its vapors. The second polymeric layer comprising PS-b-PMMA (block-co-polymer, BCP) film the on top of the thermally labile substrate (e.g., partially silica-coated polymeric substrate) is kept on a petri dish attached with legs stand (to avoid direct contact of the solvent with petri dish). Annealing chamber is opened and the Petri dish containing sample is kept inside the chamber and lid is closed immediately to expose the BCP film to the vapors of THF. The BCP film is allowed to absorb the vapors and get swelled for 15 min to self-assemble by the movement of polymer chains. After the exposure, the BCP film is taken out and kept inside a fume hood for 4 hours to complete the evaporation of trapped vapors of THF.

Example 4

Passivation Process on the Thermally Labile Substrate

The thermally labile substrate (e.g., partially silica-coated polymeric substrate) is exposed to $O_2$ plasma for five min to clean the surface. Then the substrate is loaded in a commercial ALD (Savannah S100, Veeco) at a temperature between 75 and 80° C. by keeping it over three adjacently placed Teflon discs to avoid direct contact of polymer surface to the chamber and hence creating a passage for vapors of organometallic precursor to reach the bottom surface of substrate. The substrate is allowed to stabilize for 10 min to attain thermal equilibrium. Passivation is performed by depositing 100 cycles of $Al_2O_3$ using the following sequence: TMA pulse/purge/H2O pulse/purge=0.015 sec/10 sec/0.015 sec/350 sec at a temperature between 75 and 80° C.

Thermally labile polymeric substrates are not only sensitive to elevated temperatures but might be also reactive to the organometallic precursors used in ALD/SIS processes (e.g., leading to at least partial adsorption of the precursor on or within the polymeric substrate). Hence, the prevention of adsorption of organometallic precursors to the polymeric substrate by surface passivation is essential before the SIS process for pattern transfer on these sensitive substrates.

Figure 7A:
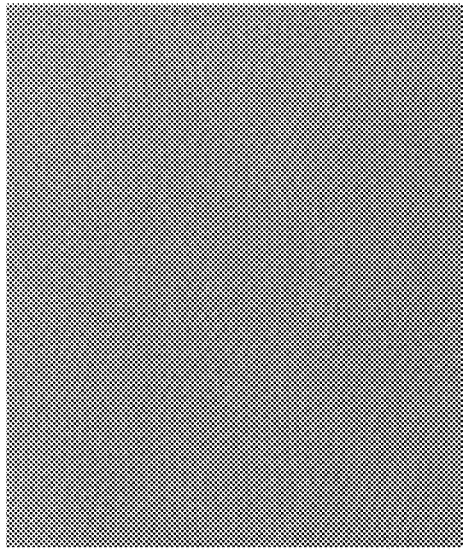
FIGS. 7A-E represent SEM images of PS-b-PMMA layer fabricated over a thermally labile polymeric substrate.
Figure 7B:
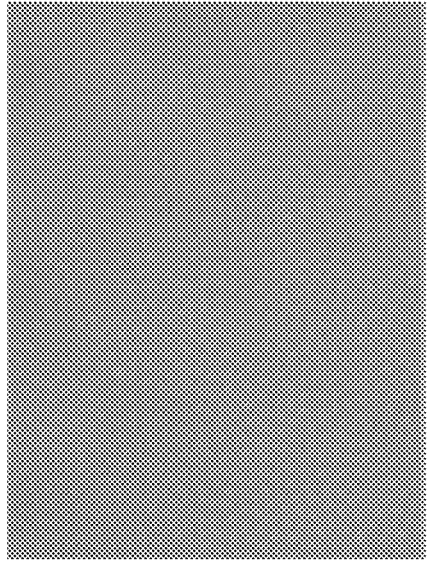
Figure 7C:
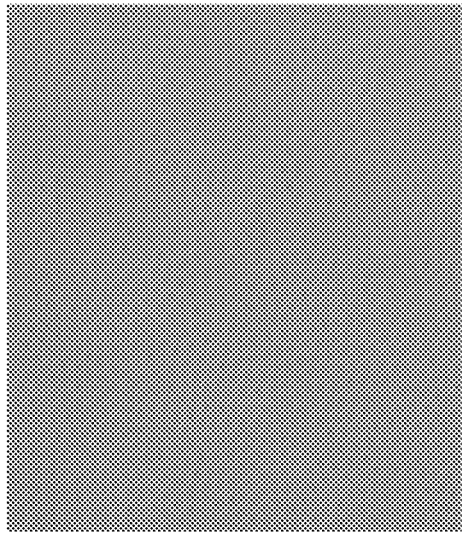

SEM image of self-assembled BCP layer fabricated on the top of a polymeric substrate as described hereinabove is shown in FIG. 7A. The thermal stability of the BCP layer is also determined by heating the polymer substrate with the BCP layer at 80° C. for 3 hours. Retention of self-assembly of BCP and absence of any degradation of polymer substrate evaluated the thermal compatibility for SIS process at 80° C., as evident in SEM image FIG. 7B. However, when the BCP layer on the polymer substrate is subjected to the organometallic precursor (TMA) during the SIS process, the self-assembly of the BCP cannot be maintained (FIG. 7C).

Figure 7D:
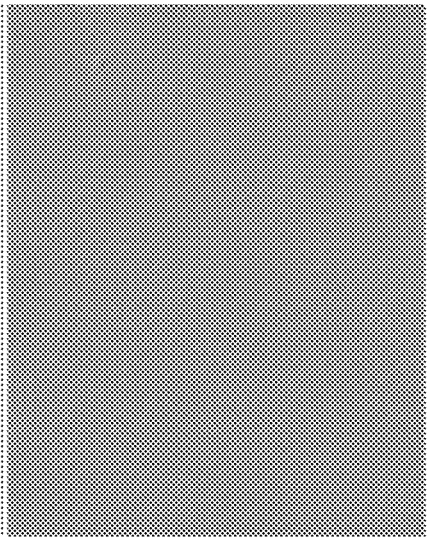
Figure 7E:
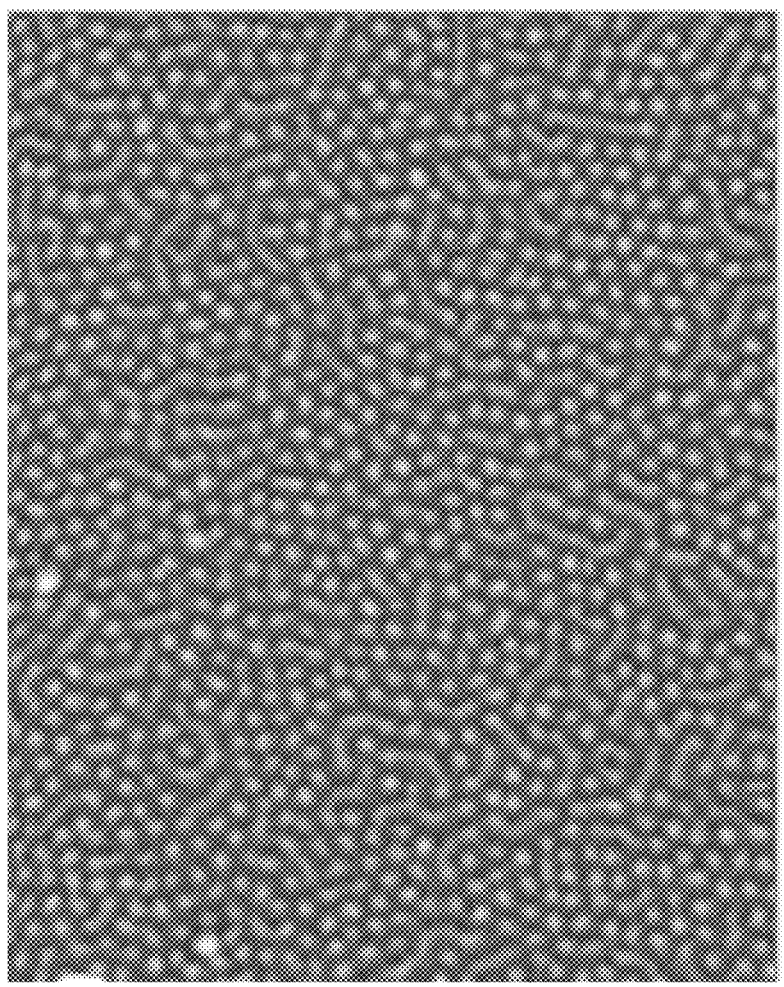

Notably, exposing the polymer substrate to the organometallic precursors prior to the BCP layer fabrication can passivate the reactive sites on the surface of polymer substrate. Here, 100 cycles of $Al_2O_3$ is deposited on the polymer substrate by ALD using TMA and water as precursors, prior to fabrication of BCP layer. The occurrence of SIS process in the BCP layer over the passivated polymer substrate is evident by the reversal of contrast for the domains of BCP layer shown in FIG. 7D. Furthermore, the inorganic nano-structure created after $O_2$ plasma etching (shown in FIG. 7E) confirmed the growth of nanostructures by SIS on a thermally labile polymeric substrate.

While the present invention has been particularly described, persons skilled in the art will appreciate that many variations and modifications can be made. Therefore, the invention is not to be construed as restricted to the particularly described embodiments, and the scope and concept of the invention will be more readily understood by reference to the claims, which follow.

What is claimed is:

1. A method for fabricating a 3D nano-structure bound to a thermally labile polymer, comprising:
   a. forming a template by contacting an outer surface of said thermally labile polymer with a polymer and subjecting the thermally labile polymer in contact with the polymer to solvent vapor annealing, wherein said polymer comprises reacting sites for one or more material precursors; wherein said thermally labile polymer undergoes deformation or substantially losses any one of: structural intactness, tensile strength, and functional properties upon exposure of said thermally labile polymer to a temperature above 100° C.;

b. exposing said template with the one or more material precursors for a time period sufficient to bind the one or more material precursors with at least a portion of said reacting sites, thereby forming a complex;

c. oxidizing said complex; and d. repeating steps b and c n times, wherein n is between 0 and 1000;

wherein steps a to d are performed at a temperature compatible with said thermally labile polymer, thereby fabricating said 3D nano-structure bound to the outer surface of said thermally labile polymer, wherein said 3D nano-structure is characterized by an aspect ratio of 1:1 to 1:10; wherein said method is performed at a temperature below 90° C.; wherein said method further comprises performing a passivation step by exposing said thermally labile polymer with said one or more material precursors; and wherein said passivation step is performed before said step a.

2. The method of claim 1, wherein said one or more material precursors comprises a plurality of distinct material precursors; wherein each of said distinct material precursors comprises a distinct metal, and wherein the method is for fabricating a 3D nano-structure comprising a plurality of layers, each of the plurality of layers comprises a distinct metal.

3. The method of claim 1, wherein the outer surface of said thermally labile polymer is an organic polymer being devoid of inorganic material.

4. The method of claim 1, further comprising (i) a first etching step, selected from the group consisting of: plasma etching, heat treatment and UV-ozone exposure, thereby removing at least a portion of said polymer; and (ii) a second etching step, comprising reactive ion etching, thereby removing at least a portion of said 3D nano-structure; wherein said first etching step and said second etching step are performed at a temperature below 90° C.

5. The method of claim 4, wherein said 3D nano-structure maintains substantially its configuration after said first etching step and said second etching step; and wherein said configuration is determined by the pattern of said template.

6. The method of claim 1, further comprising performing a passivation step before said step a; wherein said passivation step comprises: (i) exposing said thermally labile polymer with said one or more material precursors; (ii) performing said step c; (iii) repeating steps (i) and (ii) n times, wherein n is between 1 and 100; wherein the material the one or more material precursors are gaseous precursors; wherein said exposing is by diffusion of said gaseous precursors; and wherein the one or more material precursors comprises a metal selected from the group comprising: aluminum (Al), zinc (Zn), tungsten (W), titanium (Ti), silicon (Si), zirconium (Zr), hafnium (Hf), hafnium (Hf), tin (Sn), gallium (Ga), molybdenum (Mo), nickel (Ni), vanadium (V), platinum (Pt), tantalum (Ta), germanium (Ge) and Niobium (Nb), or any combination thereof.

7. The method of claim 1, wherein said oxidizing is by a compound selected from the group consisting of: water, oxygen, and hydrogen peroxide or any combination thereof.

8. The method of claim 1, wherein said template is characterized by a pattern of structurally ordered polymeric blocks being in a form of aligned cylinders; wherein said polymer comprises a block copolymer configured to form a pattern of structurally ordered polymeric blocks; wherein said block copolymer comprises at least two polymers selected from the group consisting of: polystyrene (PS), poly(n-alkyl methacrylate) (PnAMA), poly(n-butyl methacrylate) (PBMA), poly(methyl methacrylate) (PMMA), poly(2-vinylpyridine) (P2VP), poly(ferrocenyldimethylsilane) (PFDMS), poly(dimethylsiloxane) (PDMS), polyisoprene, (PI), poly(ethylene-alt-propylene) (PEP), polyethylene (PE), polybutadiene (PB), poly(ethylene oxide) (PEO), poly(ferrocenylethylmethylsilane) (PFEMS), poly(tert-butyl methacrylate) (PtBMA), poly(α-methylstyrene) (PαMS), poly(4-hydroxystyrene) (PHS), and poly(4-vinylpyridine) (P4VP) or any combination thereof.

* * * * *